United States Patent [19]
Sasaki

[11] Patent Number: 5,539,318
[45] Date of Patent: Jul. 23, 1996

[54] RESIDUAL CAPACITY METER FOR ELECTRIC CAR BATTERY

[75] Inventor: Torahiko Sasaki, Mishima, Japan

[73] Assignee: Toyota Jidosha Kabushiki Kaisha, Aichi, Japan

[21] Appl. No.: 89,105

[22] Filed: Jul. 12, 1993

[30] Foreign Application Priority Data

| | | | |
|---|---|---|---|
| Jul. 16, 1992 | [JP] | Japan | 4-189443 |
| Aug. 11, 1992 | [JP] | Japan | 4-214406 |
| Feb. 23, 1993 | [JP] | Japan | 5-033161 |

[51] Int. Cl.$^6$ ............................. G01N 27/416
[52] U.S. Cl. ............................. 324/428; 324/427
[58] Field of Search ................... 324/426, 427, 324/428; 320/48; 340/636

[56] References Cited

U.S. PATENT DOCUMENTS

| | | | |
|---|---|---|---|
| 4,377,787 | 3/1983 | Kikuoka et al. | 324/431 |
| 4,558,281 | 12/1985 | Codd et al. | 324/433 |
| 4,849,700 | 7/1989 | Morioka et al. | 324/427 |
| 5,166,623 | 11/1992 | Ganio | 324/427 |
| 5,281,919 | 1/1994 | Palanisamy | 324/427 |
| 5,404,106 | 4/1995 | Matsuda | 324/431 |
| 5,451,881 | 9/1995 | Finger | 324/433 |

FOREIGN PATENT DOCUMENTS

| | | |
|---|---|---|
| 56-28476 | 3/1981 | Japan . |
| 63-157078 | 6/1988 | Japan . |
| 63-208773 | 8/1988 | Japan . |
| 63-261179 | 10/1988 | Japan . |
| 1-229986 | 9/1989 | Japan . |
| 4-156205 | 5/1992 | Japan . |

*Primary Examiner*—Kenneth A. Wieder
*Assistant Examiner*—Glenn W. Brown
*Attorney, Agent, or Firm*—Oliff & Berridge

[57] ABSTRACT

The voltage and current of a main battery used to drive a motor of an electric car is detected by a voltmeter and ammeter. The V-I characteristic is detected by a V-I characteristic computing means by reading the voltage and current when the battery current is equal to or greater than 0.75 C and is increasing (high load state). The relation between the two is stored, and from the actually measured V-I characteristic and the stored relation, the residual capacity of the battery is computed. The SOC is also determined by a SOC computing means 20 according to the power integration method, and the degree of deterioration of the battery is computed from this SOC and the residual capacity. By correcting the full charge capacity from the power integration method based on this degree of deterioration in order to compute the SOC, errors arising in the power integration method are prevented and measurement precision is improved.

7 Claims, 19 Drawing Sheets

OVERALL CONSTRUCTION

10: MAIN BATTERY

OVERALL CONSTRUCTION

RESIDUAL CAPACITY METER FOR ELECTRIC CAR BATTERY

BACKGROUND OF THE INVENTION

1. Field of the Invention

This invention relates to a residual capacity meter for detecting the degree of deterioration of a battery, and measuring the residual capacity of the battery taking into account the degree of deterioration.

2. Description of the Prior Art

A motor-driven electric car is known in the art which generates very low pollution. This electric car is powered by batteries, and the state of charge of these batteries has to be measured. The power in the batteries is used to drive the motor, and when the residual capacity in the batteries approaches 0, the car can no longer run. It is therefore necessary to charge the batteries before the residual capacity has fallen below a predetermined value, and to measure this state of charge.

Various types of charge meters have been described in the art. A power integrating state of charge (SOC) meter exists, for example, which integrates the power stored or discharged by the battery, compares it with the previously known electrical cal capacity of the battery, and thereby measures the SOC. Using this type of SOC meter there is no need to modify the battery in any way, and as the SOC meter is reset when the battery is full due to regular charging, a relatively accurate SOC measurement can be made.

This SOC meter however assumes that the capacity of the battery when fully charged does not change, and if this capacity does change, the measurement accuracy becomes poorer. In particular, if the SOC is low, i.e. if much of the battery power has been discharged, the precision of the residual capacity obtained by subtracting the electrical capacity when the battery has discharged from the capacity when the battery is full, is no longer good.

In order to solve this problem, there are methods for determining residual capacity such as is disclosed, for example, in Japanese Tokkai Sho 63-157078. This method measures the capacity remaining in a common lead storage battery from the current and voltage when the battery is discharging a high current. The method is moreover based on the fact that the residual capacity of a lead battery has a certain correlation with the differential internal resistance of the battery for high current discharge (obtained as the linear slope of voltage vs. current for high discharge current). In other words, as disclosed in Tokkai Sho 63-157078, if the value of the current is fixed when a high current is being discharged (discharge current 200A), there is a good correlation between battery voltage and residual capacity. If the correlation between discharge voltage and residual capacity is found for different discharge voltages, the residual battery capacity can be found from the current and voltage for a high discharge current. Using this method, the residual battery capacity can be measured without modifying the battery in any way simply by measuring current and voltage. It is therefore regarded as suitable for measuring the residual battery capacity in an electric car.

The aforesaid conventional method can however only be applied when the discharge current is large. In other words, when the current is small, the relation between voltage/current characteristics and residual battery capacity fluctuates considerably and an accurate measurement of residual capacity cannot be obtained. This is considered to be due to the fact that immediately after battery charging or after prolonged discharge, the internal state of the battery is not the same, and for small current values, the voltage/current characteristics change as a result of the internal state of the battery.

For this reason, the voltage and discharge current are measured under conditions of high discharge current, and to ensure that a high discharge current is obtained, a separate discharge device must be connected so as to pass a large current. This discharge device necessarily has a large size, and as the battery capacity is reduced by this discharge, the running distance of the car for one charge is also reduced.

Alternatively, in Tokkai Hei 1-229986, a method is disclosed for measuring the residual capacity in an auxiliary battery of an engine-driven car from the current and voltage when the engine starts. As this type of method makes use of the fact that a high current flows when the engine starts, it can be applied only to an engine-driven car, and could not be applied to measure the residual battery capacity in an electric car.

Although for example a lead battery can normally be charged and discharged about 1000 times, the battery deteriorates by repeating the charging, and the full charge capacity decreases. In order to suitably measure the residual battery capacity, therefore, it is necessary to detect its degree of deterioration.

Tokkai Sho 63-261179 relates to an auxiliary battery of a car, and it also shows a device for detecting the degree of deterioration of the battery. Using this device, the differential internal resistance of the battery is found from the battery voltage when the battery is discharging a high current. As there is a good correlation between this differential internal resistance and the residual battery capacity, the residual capacity can be found from the measured differential internal resistance. The average current when the set voltage at which the voltage regulator operates is reached, is also found. The average current when this set voltage is reached is smaller the higher the full charge capacity, and the higher the residual capacity. By determining the full charge capacity from the residual capacity as found from the differential internal resistance and from the average current when the set voltage is reached, the degree of deterioration of the battery may be detected by comparing it with the rated full charge capacity.

If the degree of deterioration is thus determined, accurate values for SOC and residual capacity can be detected. In ordinary cases, the residual capacity is expressed by the electrical capacity Ah, and SOC is expressed as the residual capacity percentage of the full charge capacity. In detecting battery deterioration by the aforesaid prior art, the average charging current must be measured at the set voltage at which the voltage regulator operates. In the auxiliary battery of a gasoline engine, as the battery is always charging when the car is running, a situation often arises where the voltage regulator operates. In an electric car, however, the battery is mainly discharging when the car is running, and the average charging current, not in the highly charged state but when the set voltage has been reached, cannot be measured. Further, when the battery is being charged, the voltage is constant only in the final stage of charging, and it is impossible to accurately know the residual capacity at that time.

In the aforesaid example of the prior art, therefore, the degree of deterioration of the main battery used to drive the motor of an electric car could not be detected. It was also impossible to detect the precise value of the residual battery capacity taking account of the degree of deterioration.

SUMMARY OF THE INVENTION

It is therefore an object of this invention to solve the aforesaid problems by providing a residual battery capacity meter suitable for an electric car which detects the degree of deterioration of the battery, and detects an accurate value of the residual capacity taking this into account.

The residual capacity meter according to this invention for detecting the deterioration of a battery used for driving an electric car motor is characterized in that it comprises an open voltage detecting means for detecting the open voltage of the battery from the battery voltage when the car is at rest, a means for detecting residual capacity of the battery when the car is at rest from the detected open voltage, a discharge electrical capacity detecting means for detecting the discharge electrical capacity of the battery based on the integrated value of the discharge current of the battery, a full charge capacity detecting means for computing the full charge capacity of the battery from the residual capacity when the car is at rest and from the discharge electrical capacity, and a deterioration computing means which computes the degree of deterioration from the full charge capacity obtained and the rated full charge capacity.

Further, the residual capacity meter according to this invention for measuring the residual capacity of a battery used for driving an electric car motor taking account of the degree of deterioration of the battery is characterized in that it comprises an open voltage detecting means for detecting the open voltage of the battery from the battery voltage when the car is at rest, a means for detecting the residual capacity of the battery when the car is at rest from the detected open voltage, a discharge electrical capacity detecting means for detecting the discharge electrical capacity of the battery based on the integrated value of the discharge current of the battery, a full charge capacity detecting means for computing the full charge capacity of the battery from the residual capacity when the car is at rest and from the discharge electrical capacity, and a residual capacity detecting means for computing the residual capacity of the battery from the computed full charge capacity and the detected value of the discharge electrical capacity.

The battery voltage depends on the residual capacity of the battery, and the battery voltage which is normally measured changes due to the effect of discharge current. In an electric car, however, when the car is at rest, there is no discharge current and no charge current due to regenerative braking, hence the open voltage of the battery can be measured. In this invention, the open voltage is found from the battery voltage when the car is at rest, and the residual capacity at rest is computed from this.

Also, according to this invention, the discharged electrical capacity which is the integral of the discharge current of the battery, is detected. The residual capacity can therefore be detected by subtracting this discharge electrical capacity from the full charge capacity. The SOC can be detected by dividing the residual capacity by the full charge capacity.

According to this invention, the full charge capacity is not fixed at the rated capacity, but varies with the measurement. The actual full charge capacity can be computed by adding the residual capacity at rest and the discharged electrical capacity at the time of measurement. The degree of deterioration of the battery can be detected by comparing this actual full charge capacity with the rated full charge capacity. A precise residual capacity can then be found by correcting the full charge capacity obtained when the residual capacity is computed from the aforesaid discharged electrical capacity.

If the full charge capacity is computed at only one point, large errors arise, and it is therefore desirable to calculate the full charge capacity from the residual capacity at a plurality of different points used for discharge. A particularly satisfactory method is to detect the degree of deterioration after the ignition switch is turned OFF after the car has been running, and then correct the full charge capacity.

A suitable residual capacity meter for driving an electric car motor according to this invention is characterized in that it comprises a current detecting means for detecting the discharge current of the battery, a change state detecting means for detecting the change state of discharge current detected by this current detecting means, a voltage detecting means for detecting the discharge voltage when the battery is discharging, a condition judging means for judging whether or not the condition is satisfied that the discharge current from the detection results of the current detecting means and change state detecting means is equal to or greater than a predetermined value, and whether or not the discharge current is increasing, and a residual capacity detecting means for computing the residual battery capacity based on a preset map showing the residual capacity relative to the discharge current and discharge voltage when it is judged by the condition judging means that the aforesaid condition is satisfied.

In the residual battery capacity meter having the aforesaid construction according to this invention, it is judged whether or not the condition is satisfied that the discharge current is equal to or greater than a predetermined value, and whether or not the discharge current is increasing. If the condition is satisfied depending on the judgment results, the residual battery capacity is computed from the detected voltage and current based on the preset map of discharge voltage and residual capacity. The residual battery capacity is thereby computed when there is a good correlation between voltage and battery capacity, and a precise measurement of residual capacity can be made.

In particular, according to this invention, the residual capacity is measured only when the discharge current is increasing. This is based on new knowledge that when the discharge current is decreasing, a good correlation between the voltage-current characteristic and residual capacity is not maintained. By providing this condition, therefore, the precision of measuring the residual capacity is increased.

Further, as the aforesaid condition is satisfied when an electric car accelerates, it often arises in the normal running of the car. A precise measurement of residual capacity can therefore be performed frequently without the need to provide an additional resistance and without wasteful consumption of power.

Another form of the residual battery capacity meter according to this invention is characterized in that it comprises a current detecting means for detecting the discharge current of the battery, a change state detecting means for detecting the change state of discharge current detected by this current detecting means, a voltage detecting means for detecting the discharge voltage when the battery is discharging, a condition judging means for judging whether or not the condition is satisfied that the discharge current from the detection results of the current detecting means and change detecting means is equal to or greater than a predetermined value, and whether or not the discharge current is increasing, a high load residual capacity detecting means for computing the residual battery capacity on high load based on a preset map showing the residual capacity relative to the discharge current and discharge voltage when it is judged by the condition judging means that the aforesaid condition is satisfied, a charge state detecting means for computing the charge state of the battery in use by integrating the power discharged from the fully charged state, a battery capacity computing means for estimating the full charge capacity of the battery from the high load residual capacity computed by the high load residual capacity detecting means and from the charge state computed by the charge state detecting means, and a deterioration computing means for computing the degree of deterioration of the battery by comparing the computed battery capacity and the rated capacity.

The aforesaid residual battery capacity meter is further characterized in that it comprises a correcting means for correcting the charge state detected by the charge state detecting means based on the degree of deterioration computed by the deterioration computing means.

The aforesaid residual battery capacity meters are further characterized in that the deterioration detecting means computes the degree of deterioration of the battery from its charge state and its residual capacity on high load when the charge state of the battery in use is 80%–20%.

The aforesaid residual battery capacity meters are still further characterized in that they comprise a correcting means which corrects the detection result of the charge state detecting means based on the changed state of the high load residual capacity in a predetermined short period during which the degree of deterioration of the battery can be considered to be constant.

In the residual battery capacity meter having the aforesaid construction according to this invention, the high load residual capacity is detected with a predetermined timing as described hereinafter by the high load residual capacity detecting means. The charge state of the battery at the time when this high load residual capacity is detected, is computed using a power integration method by the charge state detecting means. Next, the full charge capacity of the battery is computed by the battery capacity computing means which computes the charge state and high load residual capacity of the battery at one point in time. The degree of deterioration of the battery is then calculated by the deterioration computing means which compares this capacity with the rated capacity.

By correcting the battery full charge capacity used by the charge state detecting means based on the degree of deterioration computed by the deterioration computing means, errors arising in the power integration method are corrected each time the degree of deterioration is computed. Errors in the charge state commonly measured by the power integration method can therefore be prevented.

By using the charge state of the battery and the high load residual capacity when the battery is charged to 80%–20% as data for computing the degree of deterioration of the battery, there is no need to apply a correction for discrepancies arising from self-discharge when the battery is discharging.

Further, the charge state of the battery is corrected by the charge state correcting means using the variation of high load residual capacity while the degree of deterioration of the battery is constant. The computation of degree of deterioration is then no longer based on the errors arising in the power integration method, and these errors are also suitably corrected based on real data (high load residual capacity of the battery).

In detecting the high load residual capacity of the battery, the condition judging means judges whether or not the condition is satisfied that the discharge current is equal to or greater than a predetermined value, and whether or not it is increasing. If this condition is satisfied, the high load residual capacity of the battery is then computed from the detected voltage and current based on a preset map of discharge voltage and residual capacity. The high load residual battery capacity is thereby computed when there is a good correlation between voltage and residual capacity, and a precise measurement of residual capacity can be made.

In particular, according to this invention, the measurement of high load residual capacity is made only when the discharge current is increasing. This is based on knowledge that when the discharge current is equal to or greater than a predetermined value, and is increasing, there is a good correlation between the voltage-current characteristic and residual capacity. By providing this condition, therefore, the precision of measuring the residual capacity is increased. When the discharge current is decreasing, a good correlation between the voltage-current characteristic and residual capacity is not maintained.

DESCRIPTION OF THE PREFERRED EMBODIMENTS

Figure 1:
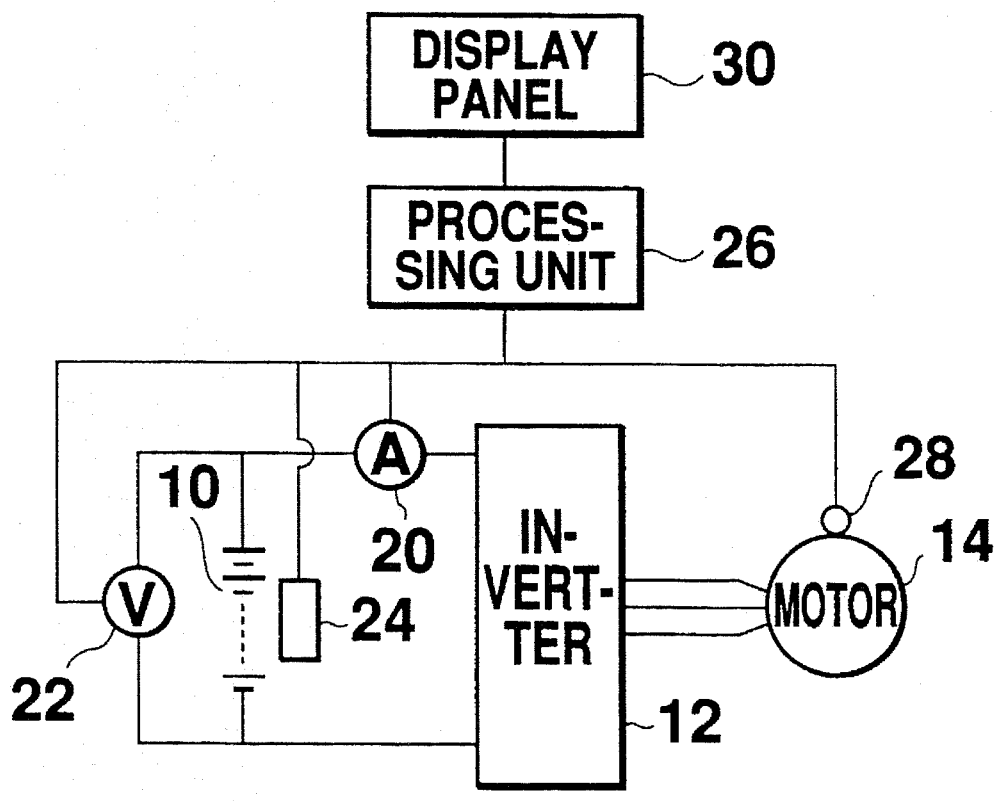
FIG. 1 is a structural diagram showing the overall structure of a preferred embodiment of the invention.

This invention will now be described in further detail with reference to the drawings. FIG. 1 is a drawing showing the construction of the essential parts of an electric car to which the residual capacity meter according to this invention is applied. A battery 10 consists of a lead storage battery, and its output is supplied to an inverter 12. The inverter 12 comprises a plurality of switching devices. The supplied DC power is converted to a predetermined AC power, and is supplied to a motor 14. This motor 14 is an AC induction motor, and is operated by an output corresponding to the power supplied by the inverter 12. The car wheels (not shown) are connected to the power shaft of the motor 14 via a gear unit so that the electric car runs according to the output of the motor 14.

An ammeter 20, voltmeter 22 and thermometer 24 are connected to the battery 10. Values measured by this ammeter 20, voltmeter 22 and thermometer 24 are supplied to a processing unit 26. The operating state of the motor 14 is detected by a revolution counter 28 which supplies a speed signal to the processing unit 26.

The processing unit 26 performs predetermined computations according to the supplied signals, and computes the degree of deterioration, residual capacity and SOC of the battery 10. A display unit 30 is also connected to the processing unit 26, the residual capacity and SOC of the battery 10 being displayed on this display unit 30. The driver can therefore know the residual capacity and SOC of the battery 10 by reading the display on the display unit 30, and can judge the distance the car can travel or whether it is necessary to charge the battery. Any kind of secondary cell, including a lead cell or a nickel-cadmium cell, may be used for the battery 10.

Embodiment 1

According to the first embodiment, the revolution counter 28 detects that the motor 14 is not rotating, and the processing unit 26 detects that the car has stopped. The discharge voltage of the battery 10 is then measured by the output of the voltmeter 22 at that time. As there is a given relation between this discharge voltage and the residual battery capacity, the residual battery capacity at that time is computed from the discharge voltage. The processing unit 26 also integrates and computes the electrical power of the battery 10 from the output of the ammeter 20. The degree of deterioration of the battery and its actual full charge capacity are then computed from its residual capacity and discharged capacity when the car is at rest. By using the computed full charge capacity, a precise SOC and residual capacity can always be detected.

Figure 2:
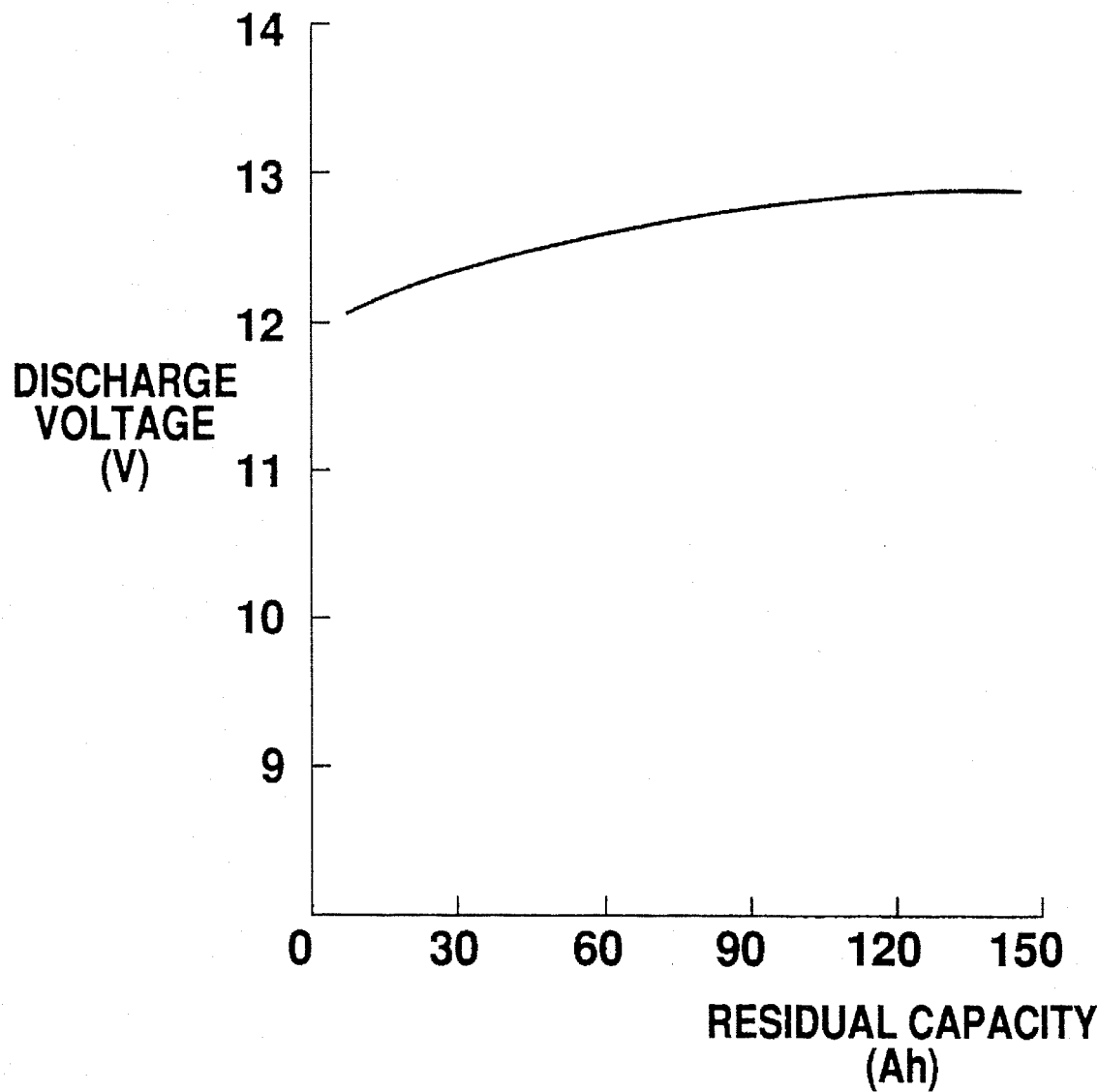
FIG. 2 is a characteristic diagram showing the relation of discharge voltage and residual capacity.

The first embodiment will now be described in greater detail. FIG. 2 shows an example of the correlation between discharge voltage and residual capacity of the lead battery. It is seen that the discharge voltage increases as the residual capacity increases. In the case of an electric car, the battery 10 is disconnected from the load when the car is at rest. The switching devices of the inverter 12 are all OFF, and the battery voltage measured by the voltmeter 22 when the car is at rest, is the discharge voltage. If the relation between residual capacity and discharge voltage of the battery 10 is first examined, and a relation of the kind shown in FIG. 2 is stored as a map, therefore, the processing unit 26 can compute the residual capacity of the battery 10 at that time from the output of the voltmeter 22 when the car is at rest. To detect the discharge voltage accurately, a switch which completely disconnects the battery 10 from the load may also be provided.

The processing unit 26 constantly detects the SOC by integrating the discharged power and charged power supplied by the ammeter 20, i.e. the SOC is calculated from the relation:

SOC=(full charge capacity−discharged power−self-discharged power)/full charge capacity The rated full charge capacity is initially used for the full charge capacity, but due to deterioration of the battery 10 described hereinafter, it is frequently updated. Also the discharged power and charged power are computed according to values measured by the ammeter 20, and the discharged power normally depends on the current during regenerative braking. Self-discharge is a natural property of the battery, and is calculated by multiplying a predetermined self-discharge per unit time, by the time elapsed from full charge.

Figure 3:
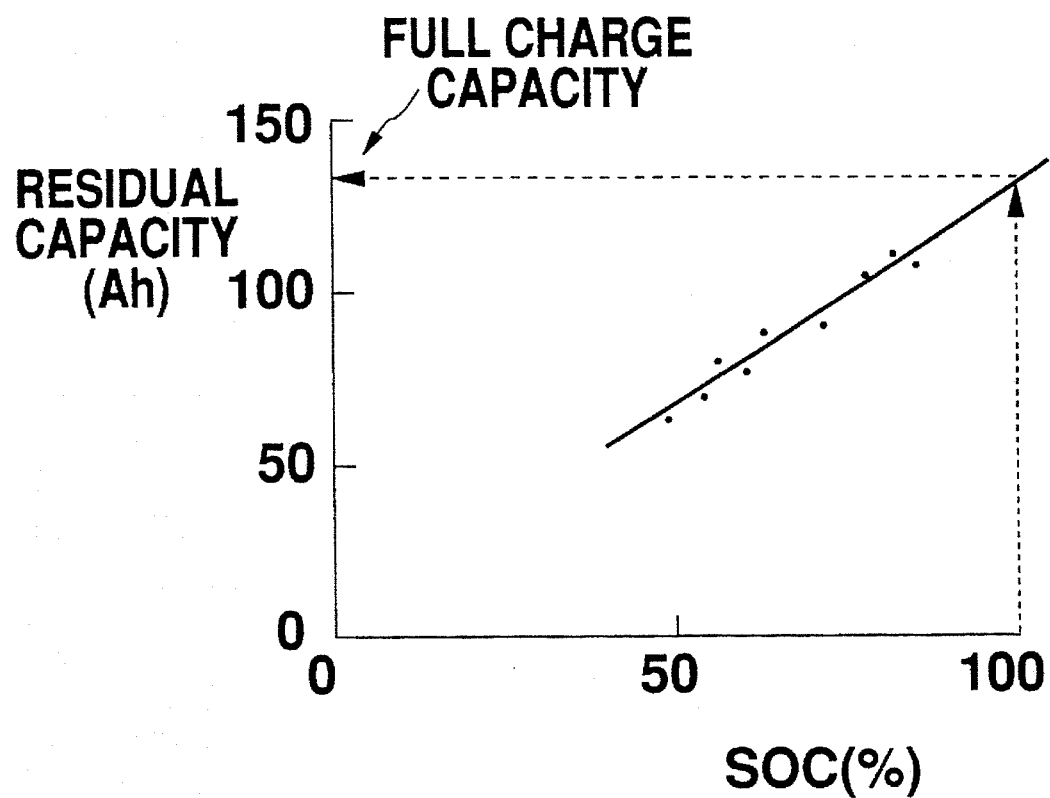
FIG. 3 is a descriptive diagram showing the method of computing the degree of deterioration.

If the residual capacity and SOC are determined when the car is at rest, the full charge capacity at that time can be calculated. For this purpose, the relation between residual capacity and SOC is plotted from the SOC when the residual capacity is determined as shown in FIG. 3. This line is extrapolated, and the residual capacity when the SOC is 100% is calculated. The residual capacity for 100% SOC is then the full charge capacity. This computation of full charge capacity is performed when a sufficient amount of data has been accumulated. It may also be performed by finding a straight line by the method of least squares, and then finding the residual capacity when the line is at 100% SOC. As the discharged power is known from the SOC when the residual capacity is measured, the full charge capacity can be computed by summing the discharged power and residual capacity. A considerable number of data may be collected, and the mean value found. By finding the full charge capacity when a sufficient number of data have been collected and not by one measurement, the precision of the full charge capacity can be improved. The processing unit 26 can therefore determine the full charge capacity of the battery 10 at a predetermined frequency.

The degree of deterioration may then be computed by:

Degree of deterioration=1−Full charge capacity/Rated capacity

A precise SOC taking account of battery deterioration may then be found as described hereintofore using the updated full charge capacity.

Further, the residual capacity can be computed by:

Residual capacity=Full charge capacity×SOC

The processing unit 24 supplies the residual capacity, SOC and degree of deterioration to a display unit 30 where these quantities are displayed. The driver can therefore precisely evaluate the status of the battery 10 by looking at the display unit 30. However, the relation between the discharge voltage and residual capacity of the battery changes with temperature, i.e. it is known that the residual capacity decreases the lower the temperature. The detected value of residual capacity based on FIG. 2 may therefore be corrected according to the battery temperature.

Figure 4:
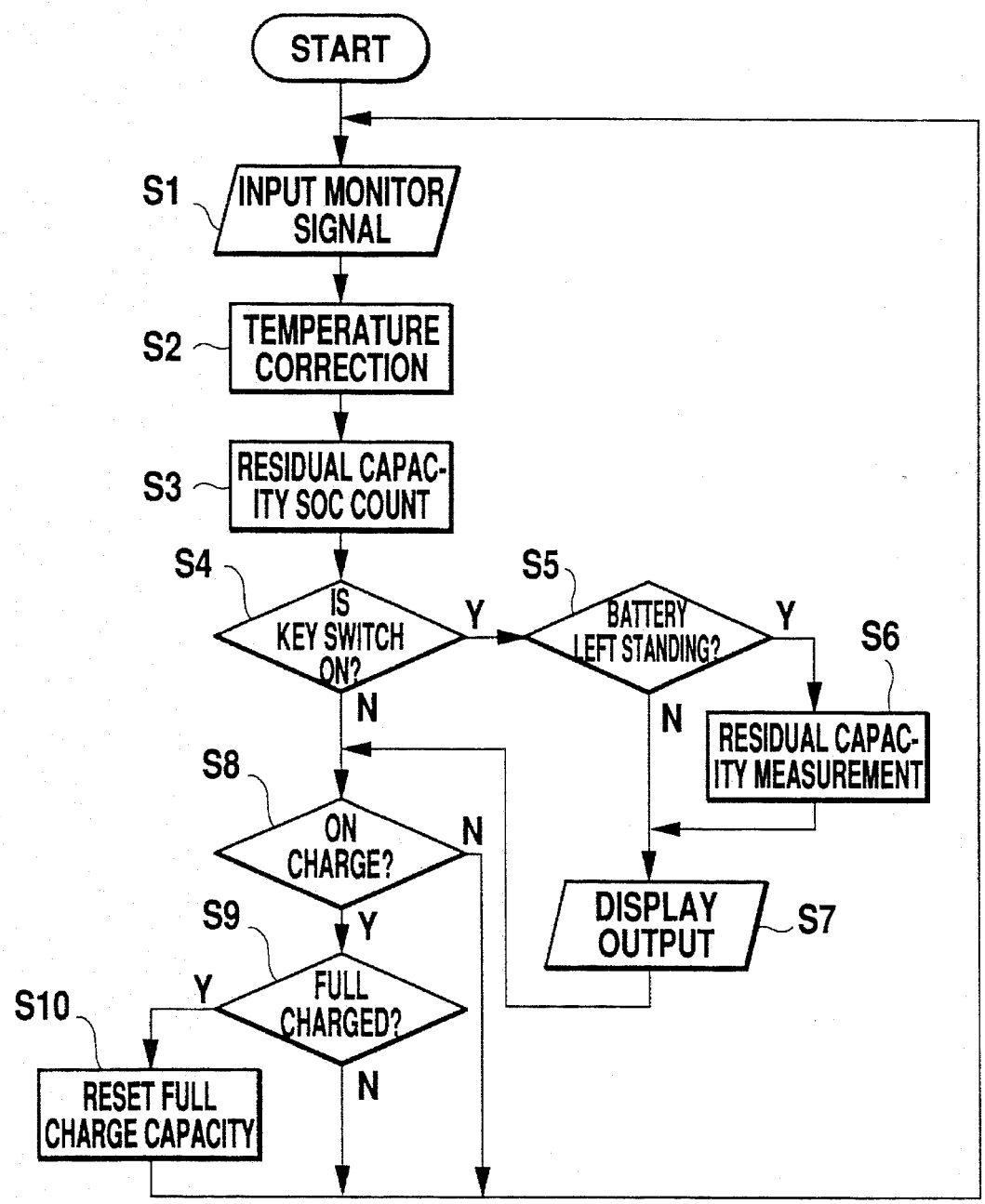
FIG. 4 is a flowchart showing the computation of the degree of deterioration and residual capacity according to one embodiment of this invention.

An example of the aforesaid computation of residual battery capacity will now be described with reference to FIG. 4.

Firstly, the current flowing through the battery 10, the battery voltage and the battery temperature are read from the values detected by the ammeter 20, voltmeter 22 and thermometer 24 (S1). Next, the current value is integrated, corrected by the detected battery temperature (S2), and the residual capacity and SOC are found (S3). The processor 24 can then identify the residual capacity and SOC, and output a corresponding display.

Next, it is judged whether or not a key switch is ON (S4). If the key switch is ON, it is judged whether or not the battery is in the open state as when the electric car is running or has stopped at a signal, etc. (S5). This judgment is made according to the output of the revolution counter 28, but may also be made according to the output of a speed sensor or the like. If the battery has been left standing, a measurement of degree of deterioration is performed as described hereintofore (S6). In other words, the residual capacity is found from the relation in FIG. 2, and the SOC at that time is input into the memory. When a certain amount of data has been accumulated concerning the degree of deterioration input in the memory, the degree of deterioration is detected and the full charge capacity is updated. The residual capacity and SOC are then updated, and a display is output based on the full charge capacity thus found (S7). The updating of the degree of deterioration may be performed at a predetermined frequency, for example when the battery is when fully charged.

If it is judged in the step S4 that the key switch is OFF and the display output in S7 has finished, it is judged whether or not the battery was on charge (S8). If it was on charge, it is judged whether or not it is now fully charged (S9). If it is fully charged, the integral of the current value is reset (S10). In these steps, the judgment as to whether the battery is fully charged is performed according to the current change and time when the battery is being charged.

The full charge capacity of the battery can therefore be updated by using the battery voltage (discharge voltage) when the car has stopped. Hence, the residual capacity and SOC can be detected according to the degree of deterioration of the battery.

If the discharge voltage is found when the battery has been left to stand, some time is required for the discharge voltage to stabilize (of the order of several minutes). The value of the discharge voltage may then be measured from the voltage change for example 1 minute after leaving the battery to stand.

According to the residual capacity meter of the first embodiment of this invention, as described hereintofore, the actual full charge capacity when the car has stopped can be detected by detecting the battery discharge voltage at that time. The degree of deterioration can thus be detected, and a precise value of residual battery capacity taking account of this deterioration can be found.

The measurement of discharge voltage when the car has stopped can be performed only intermittently, but as SOC is constantly calculated by integrating the power, a precise value of residual battery capacity can always be found from the intermittent value of discharge voltage by updating the full charge capacity.

In the first embodiment, the degree of deterioration of the battery 10 and the residual capacity taking account of this factor were computed based on the discharge voltage when the car is at rest. In this first embodiment, current is not passed through the motor 14. In the second and third embodiments described hereinafter, the degree of deterioration of the battery 10 and the residual capacity taking account of this factor are computed based on the discharge voltage and current when the car is running, i.e. when current is flowing through the motor 14.

Embodiment 2

In the second embodiment, the current flowing from the battery 10 is 0.75 C or more. When this current is increasing, (high load), a V-I characteristic computing means reads the current and voltage at that time in order to compute the V-I characteristic. As there is a good correlation under these conditions between the V-I characteristic and the residual battery capacity, this correlation is used to measure the residual capacity. In other words, according to the second embodiment, the relation between these two quantities under these conditions is first found and stored, and the residual capacity of the battery 10 is computed from the V-I characteristic and the stored correlation when these conditions actually arise.

The second embodiment will now be described in further detail.

Figure 5:
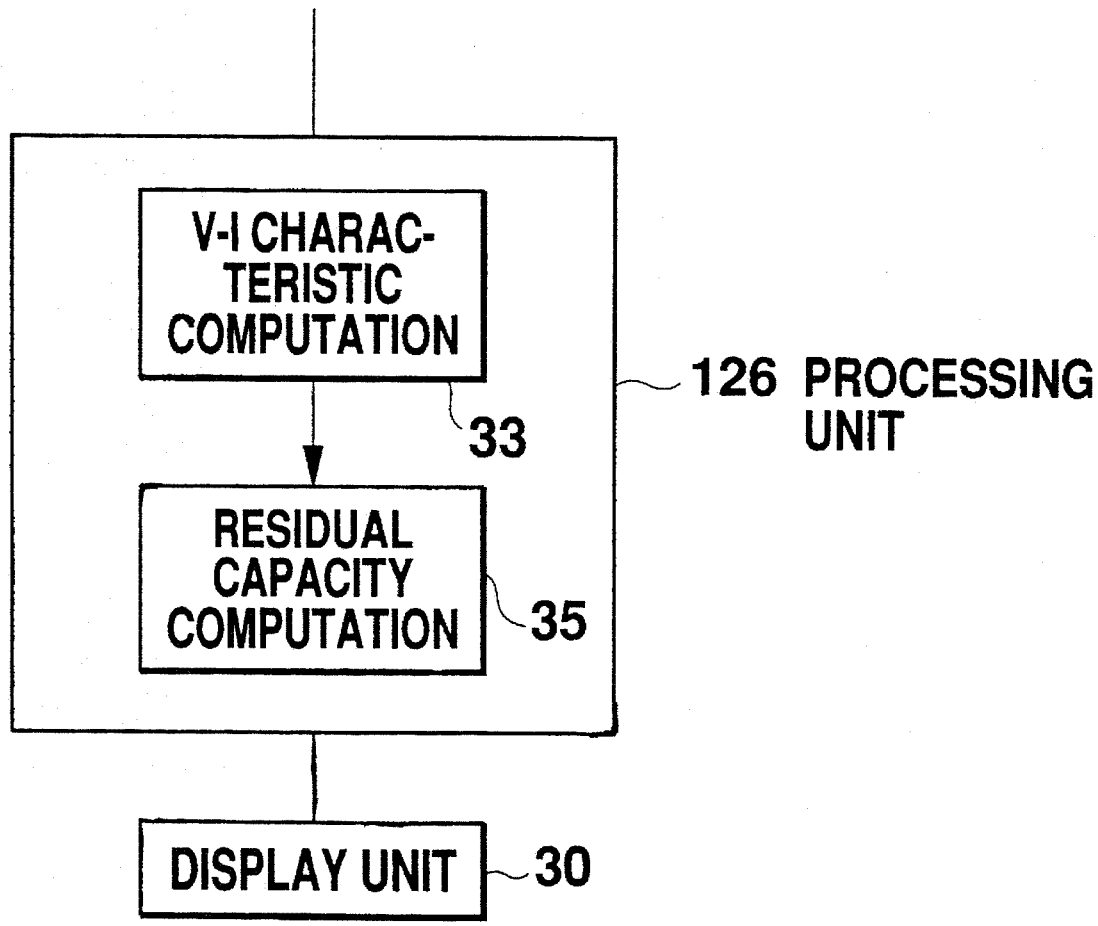
FIG. 5 is a block diagram showing the structure of a residual battery capacity meter according to a second embodiment of this invention.

FIG. 5 is a block diagram showing the structure of a processing unit 126 of the residual capacity meter according to a preferred embodiment of this invention. As in the case of the processing unit 26 of the first embodiment, this processing unit 126 is connected to an ammeter 20, voltmeter 22, thermometer 24 and revolution counter 28 from which data is input. The processing unit 126 comprises a V-I characteristic computing means 33 which inputs data from the ammeter 20, voltmeter 22, thermometer 24 and revolution counter 28, and a residual capacity computing means 35 which reads the data output by the V-I characteristic computing means so as to compute the residual battery capacity. The residual capacity computed by the residual capacity computing means 35 is displayed on a display unit 30.

The V-I characteristic computing means 33 then judges whether the value of the current detected by the ammeter 20 is equal to or greater than a predetermined value, and whether the current flowing through the battery 10 is increasing. The residual capacity computing means 35 is provided with a map showing the relation between voltage, current and residual capacity, and computes the residual capacity of the battery 10 from the discharge voltage of the battery when it has been discharged at a predetermined discharge current.

Figure 6:
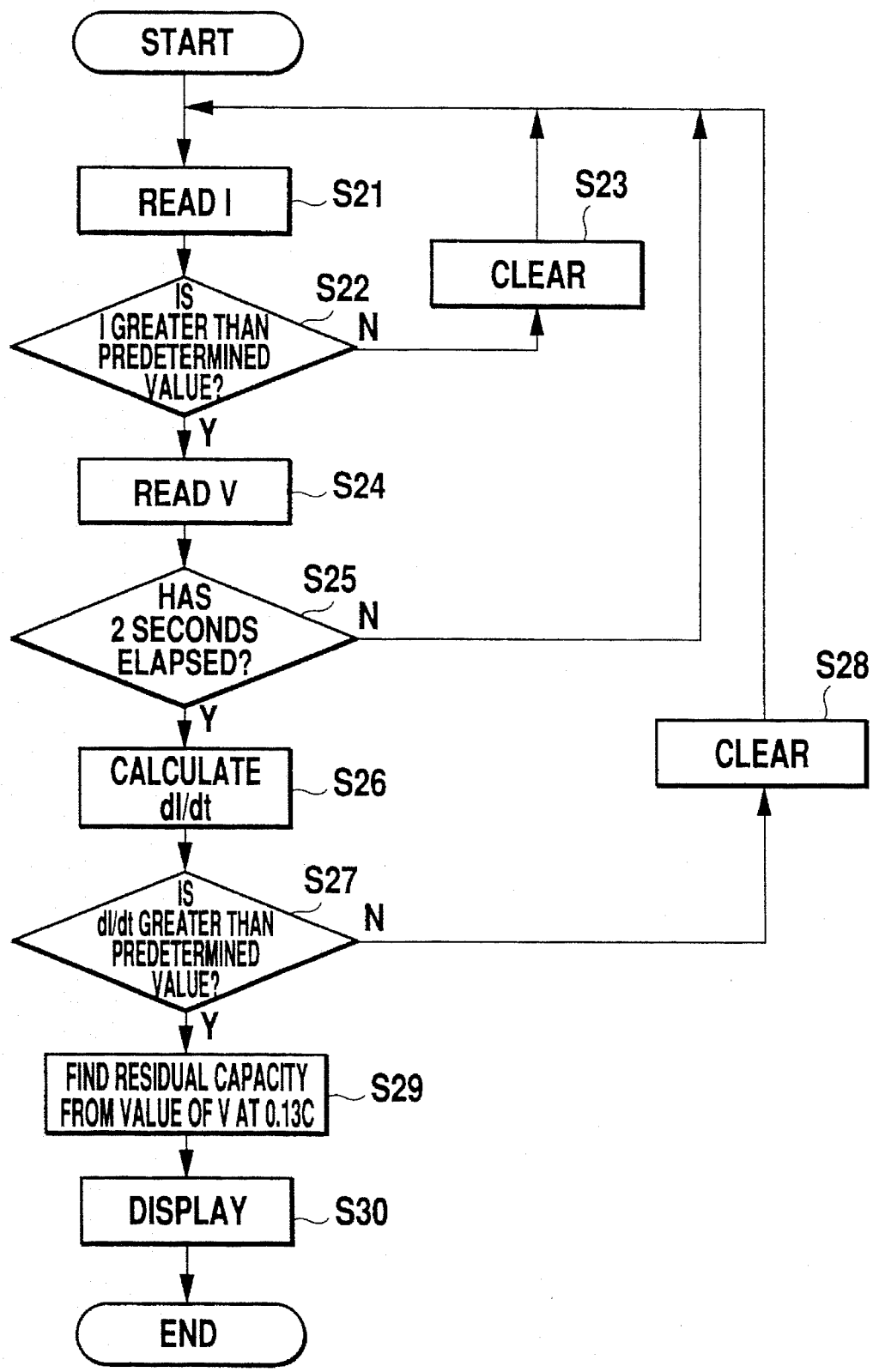
FIG. 6 is a flowchart showing the flow of operations of a residual battery capacity meter according to the second embodiment.

FIG. 6 is a flowchart showing the operation of the processing unit 126 according to this second embodiment. As shown in the figure, the V-I characteristic computing means 33 inputs a discharge current I output from the ammeter 20 (S21). Next, it is judged whether the discharge current I is equal to or greater than a predetermined value (S22). For this predetermined value, a current of for example 0.75 C is taken (this 0.75 C means that when it is fully charged, the battery 10 discharges in a time of 1/0.75=1.33 hours, which is a fairly high current). In the step S22, if the discharge current is less than the predetermined value, the data cannot be used and it is cleared (S23). The program then returns to S21.

If on the other hand it is judged in the step S22 that the discharge current of the battery 10 is equal to or greater than the predetermined value, the voltage of the battery 10 at this time is read by the voltmeter 22 (S24). It is then judged whether or not a predetermined time has elapsed (in the example of the figure, 2 seconds is about the length of time that would elapse during normal acceleration, and would be required to raise the current above the predetermined value) (S25). If this time has not elapsed, the program returns to S21 and the sequence is repeated. Therefore, if the value of the current is less than 0.75 C during these 2 seconds, the I,V data are cleared. If 2 seconds elapse for which the discharge current I is not less than 0.75 C, the current change dI/dt during these 2 seconds is calculated (S26). It is then judged whether or not this current change is equal to or greater than a predetermined value (e.g. whether there was an increase from 0.75 C–1.2 C in 2 seconds) (S27). If the increase of the current I was not greater than this predetermined value, the V,I data are cleared (S28), and the program returns to the step S21. As will be described hereinafter, this is based on the knowledge, deduced by studying the relation between the V-I characteristic and residual capacity, that a particularly good correlation is obtained not only when the discharge current I is large, but also when it is increasing. Also, in the steps S26, S27, it may be judged whether or not the current after 2 seconds is greater than a predetermined value, for example 1.2 C.

If the rate of increase of the discharge current was equal to or greater than the predetermined value, the residual capacity of the main battery is computed based on the V-I characteristic between the discharge current I and battery voltage V (S25). In other words, under high load conditions when the discharge current I is equal to or greater than the predetermined value, and when the rate of increase dI/dt of the discharge current is greater than the predetermined value, there is a good correlation between the voltage-current (V-I) characteristic and the residual capacity of the battery. The relation between the slope of the straight line showing the variation of battery voltage with respect to variation of discharge current, and the residual capacity of the battery, is therefore first stored as a map, the residual capacity of the battery is found from the slope obtained from measured data by referring to the map, the relation between voltage and residual capacity at a specified discharge current is stored as a map, and the residual capacity is then computed from the voltage obtained from measured data by referring to the map. At this time, the battery temperature is also supplied to the processing unit 126 from the thermometer 24. As the aforesaid relation between the V-I characteristic and the residual capacity varies with temperature, the residual capacity found should be corrected based on the temperature. According to the second embodiment, if the rate of increase dI/dt of the discharge current is greater than a predetermined value, the residual capacity of the battery is found from the battery voltage at 0.13 C (S29).

The residual capacity of the battery 10 found as described hereinabove, is then displayed on the display panel 30 of the electric car (S30). The driver can then know the residual capacity of the battery by looking at the display panel 30.

Hereinafter, the judgment of the aforesaid steps S22, S27, and the map used in S25, will be explained.

Figure 7:
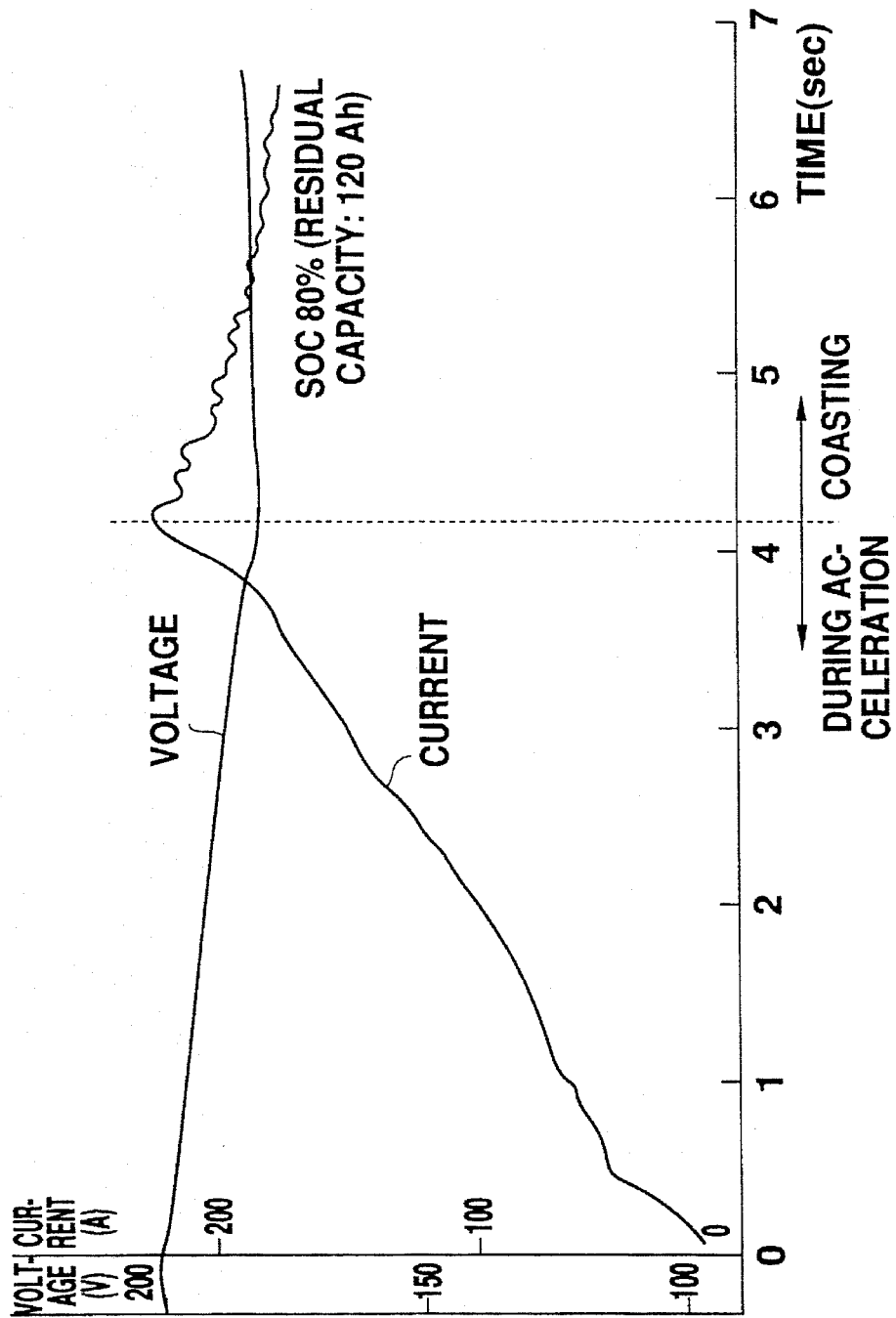
FIG. 7 is a graph showing the variation of current and voltage when the electric car is accelerating and when it is coasting.

FIG. 7 is a diagram illustrating one example of the variation of battery voltage and current when an electric van (lead battery, capacity 150 Ah) is accelerating and when it is coasting. As can be seen from FIG. 7, as the output torque of the drive motor increases during acceleration, the current increases with the elapsed time, and with the increase of current, the battery voltage decreases. On the other hand, as the output torque of the motor decreases during coasting, the current decreases with the elapsed time and the battery voltage increases. From the figure, it is also seen that there is a considerable fluctuation of current during coasting. The SOC (proportion of residual capacity with respect to full charge) was 80%, and the residual capacity was 120 Ah, at this time.

Figure 8:
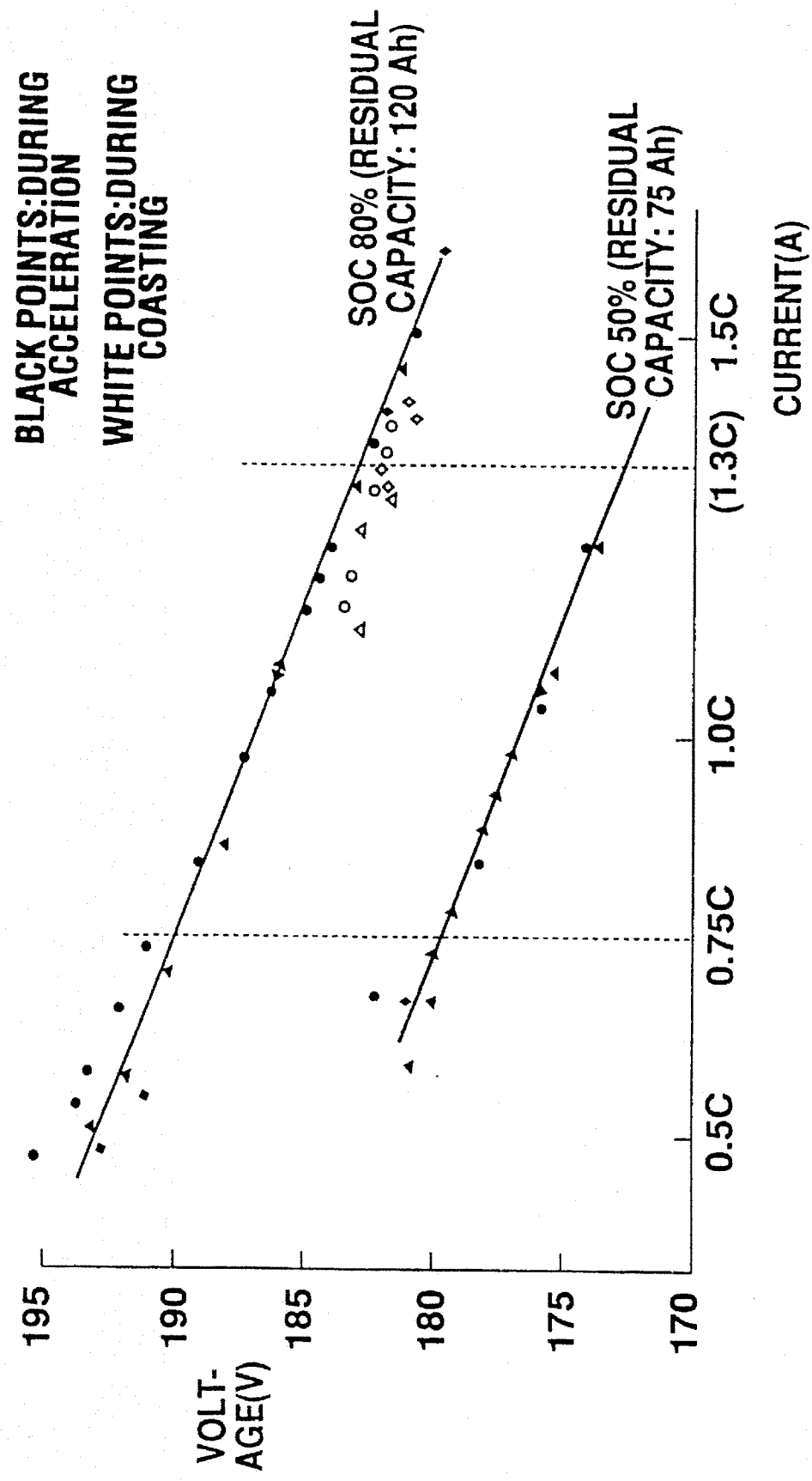
FIG. 8 is a graph showing that there are cases when there is a correlation between the battery voltage and current.

Next, FIG. 8 is a graph showing the relation between battery voltage and discharge voltage of the battery 10 when the residual capacity of the battery 10 is constant. This graph shows an example of a case where the constant residual capacity was 120 Ah (SOC=80%) and 75 Ah (SOC=50%). As can be seen from FIG. 8, when the current from the battery 10 was greater than 0.75 C, there is a very good correlation between the magnitudes of battery voltage and current. On the other hand, when the magnitude of the current from the battery 10 is less than 0.75 C, the data is fairly uneven, and a satisfactory correlation cannot be found. Also, during coasting as indicated by the white marks, a correlation between battery voltage and current could not be found.

When the car was accelerating, and the magnitude of the current flowing from the battery 10 was greater than 0.75 C, therefore, there is a certain correlation between battery voltage and current provided the residual capacity of the battery is constant. In other words, when the magnitude of the current flowing from the battery 10 is greater than 0.75 C and increasing, the residual capacity of the battery can be found by measuring the values of battery voltage and current at that time. If this condition is defined as a high load condition, the residual capacity of the battery can readily be determined by measuring the battery voltage and current on high load. Further, if the residual capacity of the battery on high load is defined as a high load residual capacity, it may be said that this high load residual capacity accurately represents the residual capacity of the battery. Alternatively, if the discharge current is fixed, the residual capacity can be determined as a parameter of the battery voltage. The residual capacity can then be found from the battery voltage measured on high load.

According to this second embodiment, in order to first measure this high load residual capacity, it is determined in the aforesaid steps S22 and S27 of FIG. 6 whether or not the battery 10 is discharging on high load. In other words, in the step S22, it is judged whether the current is equal to or greater than a predetermined value C. In the step S27, it is judged whether the rate of increase of the current is equal to or greater than the predetermined value. If these conditions are satisfied, the battery voltage is read as data, and the residual capacity of the battery is measured from the voltage data using a map (FIG. 9) described hereinafter. Thus, if the battery 10 was discharging on high load, its residual capacity is found from this value of the voltage (S29).

Figure 9:
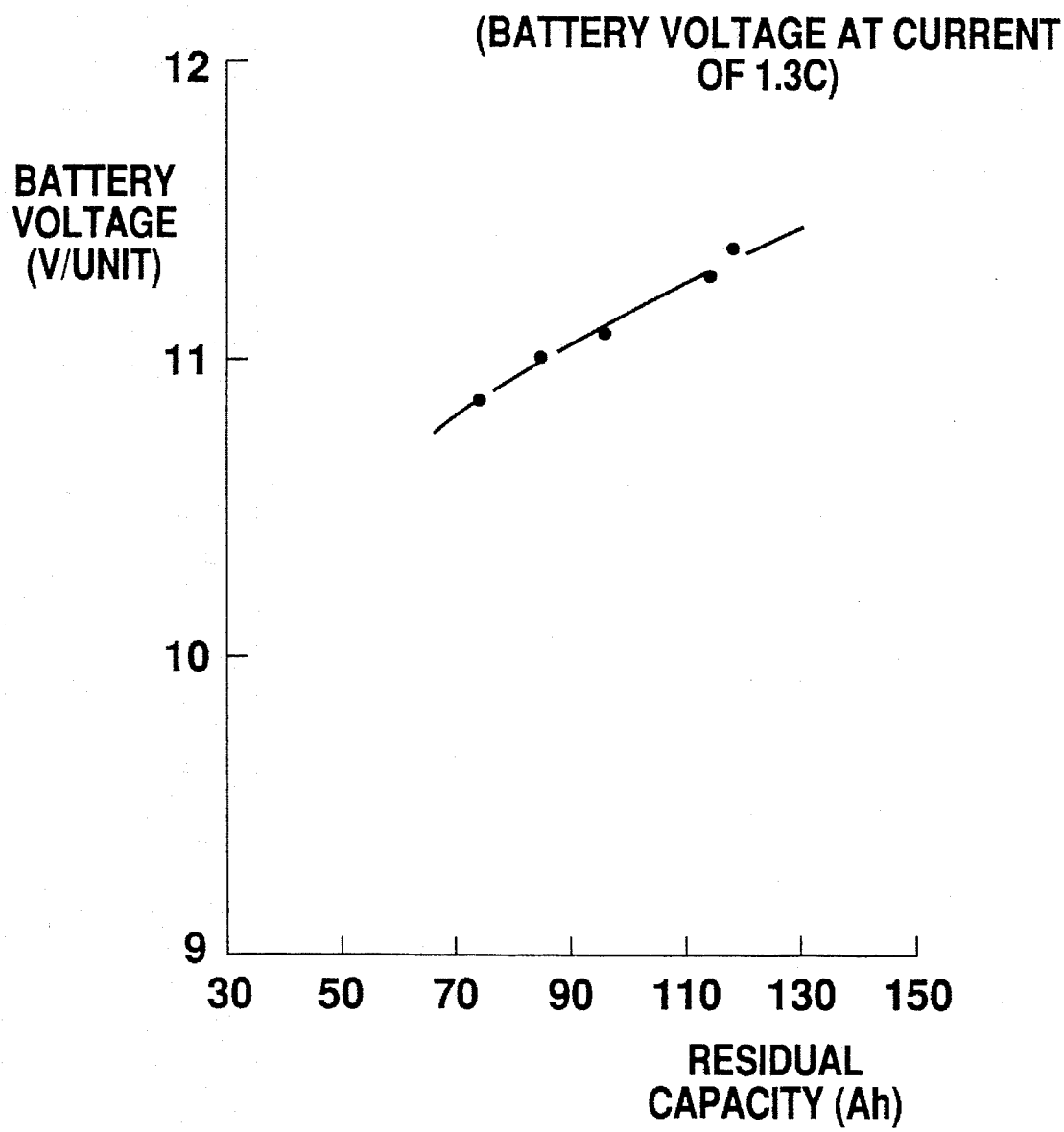
FIG. 9 is a graph showing one example of a map of battery voltage and residual capacity.

FIG. 9 is a diagram showing the relation between battery voltage, current and residual capacity on high load. The discharge current of the battery 10 at this time is 1.3C. It is seen that there is a good relation between the voltage and the residual capacity when the current has the predetermined value. The relation between battery voltage and residual capacity when the current is for example 1.3 C is stored as a map. The residual capacity of the battery can then be found from this map if the voltage at a current of 1.3 C is found when the car is actually running. In this way, as described hereintofore, the residual capacity is determined only when there is a good correlation between the V-I characteristic and residual capacity, so the residual capacity found is highly reliable.

As the aforementioned conditions often occur in normal running when the car starts, accelerates on high speed or climbs hills, etc., the determination of residual battery capacity can be performed at a suitable frequency.

Further, when the residual capacity of the battery declines, the battery voltage decreases. At the same time, in motor-driven systems, the output torque of the motor must be a predetermined value depending on the accelerator depression, etc. The output energy W is given by the product of voltage and current (W=VI), so that when the voltage decreases, the current increases correspondingly. In other words, when the residual capacity decreases, the current increases even though the car is running in the same way, and the condition of large current and large current increase is more likely to be satisfied. Now, the more the residual capacity of the battery has declined, the more precisely the driver would like to know its value. According to this device, the measurement frequency increases as the residual capacity declines, so measurements of residual capacity are performed in a highly appropriate fashion.

Figure 10:
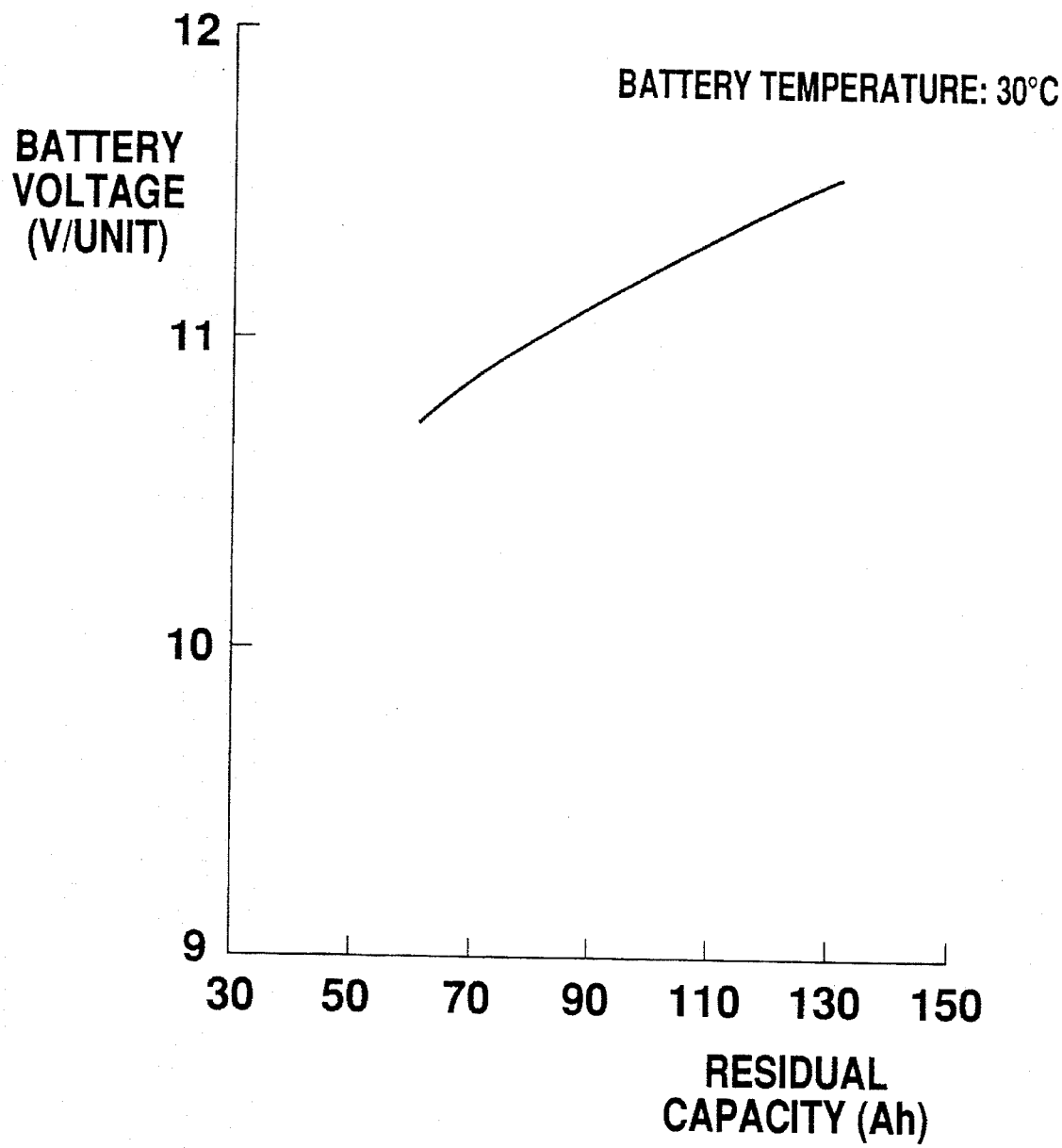
FIG. 10 is a graph showing one example of the correlation between the residual battery capacity and battery voltage when power has been discharged at a high rate.
Figure 11:
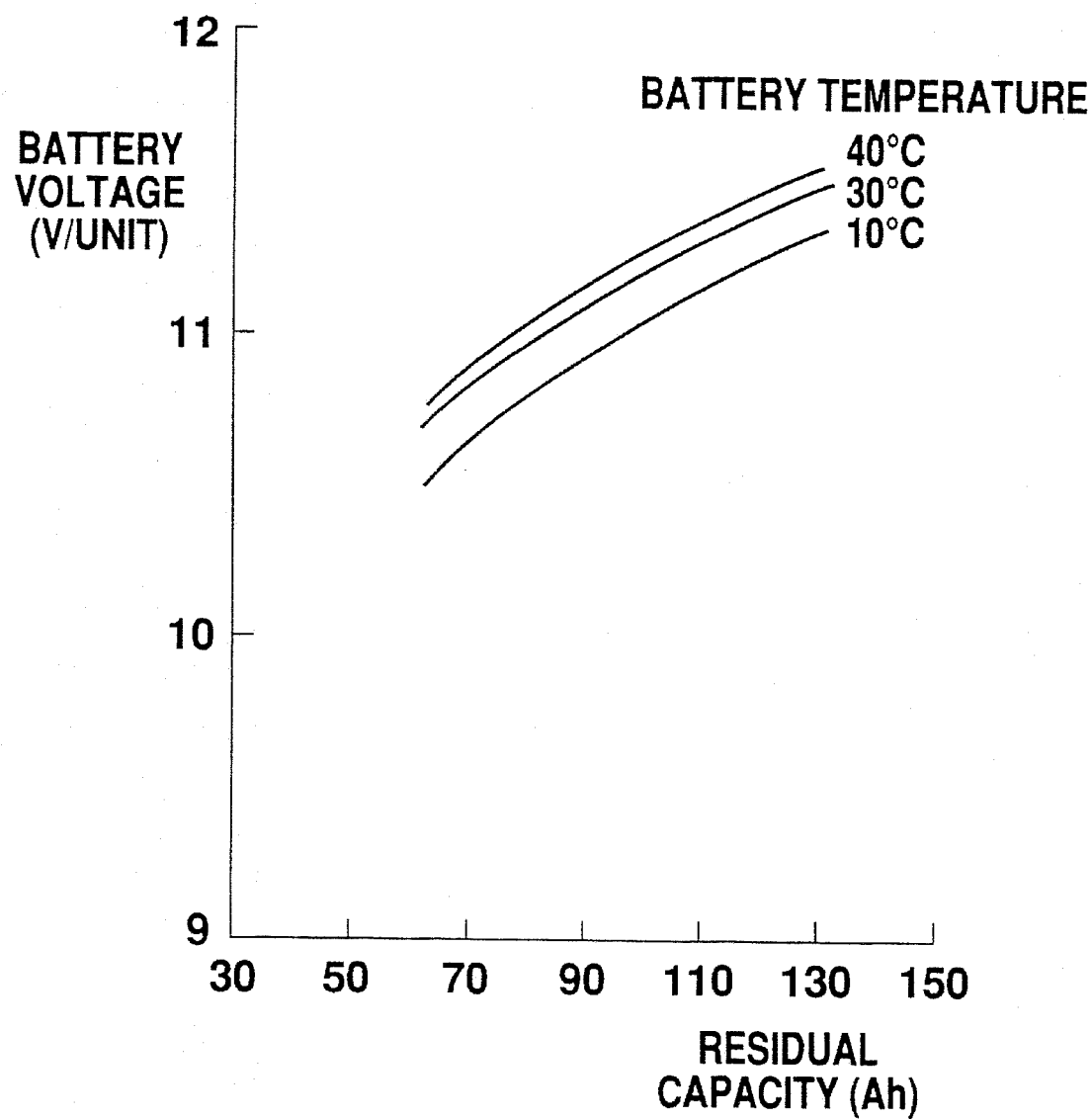
FIG. 11 is a graph showing the temperature dependence of the correlation between the battery voltage and residual capacity.

FIG. 10 is a graph showing the correlation between the voltage and residual capacity of a lead battery at 30° C. As shown in FIG. 11, this type of correlation between battery voltage and residual capacity has a temperature dependence. This temperature dependence is therefore used when computing the residual capacity, and the residual capacity is corrected based on the temperature detected by the thermometer 24.

Further, according to this embodiment, as the current and voltage are stored over a predetermined time, a voltage corresponding to any current can be estimated (or interpolated) from the stored value. The value of the voltage at 1.3 C can thus be found without actually measuring the voltage at 1.3 C, and the residual capacity can be computed from this value. Further, the correlation between the two can be found from the measured voltage and current, and if the correlation is less than a predetermined value, the computation of residual capacity may be stopped.

As described hereinbefore, in the residual battery capacity meter according to the second embodiment of the invention, the residual capacity is measured from the battery current and voltage when the car is running on high load, so measurements can be performed rapidly without having to provide another load such as a discharger. Moreover, as high load conditions often occur during the normal running of the car, there are no strict constraints on the time when the residual capacity is detected, and the residual capacity of the battery can be displayed whenever required.

Embodiment 3

As in the case of the second embodiment, the third embodiment provides a battery residual capacity meter which can suitably detect the residual capacity of a battery when an electric car is running.

Also as in the case of the second embodiment, the residual capacity meter of the third embodiment comprises a V-I characteristic detection means 42 which, when the current from the battery 10 is equal to or greater than 0.75 C and increasing (high load condition), detects the V-I characteristic by reading the voltage and current at that time. As the relation between the two has already been stored, the residual capacity of the battery 10 is computed from the V-I characteristic found and the stored relation. At the same time, the SOC computing means 43 computes the SOC by the power integration method, and computes the degree of deterioration from the SOC and the aforesaid residual capacity. The full charge capacity computed by the power integration method is corrected based on this degree of deterioration, and the SOC computed. In this way, the occurrence of errors due to the power integration method is prevented, and the measurement accuracy is improved.

Structure of Processing Unit

Figure 12:
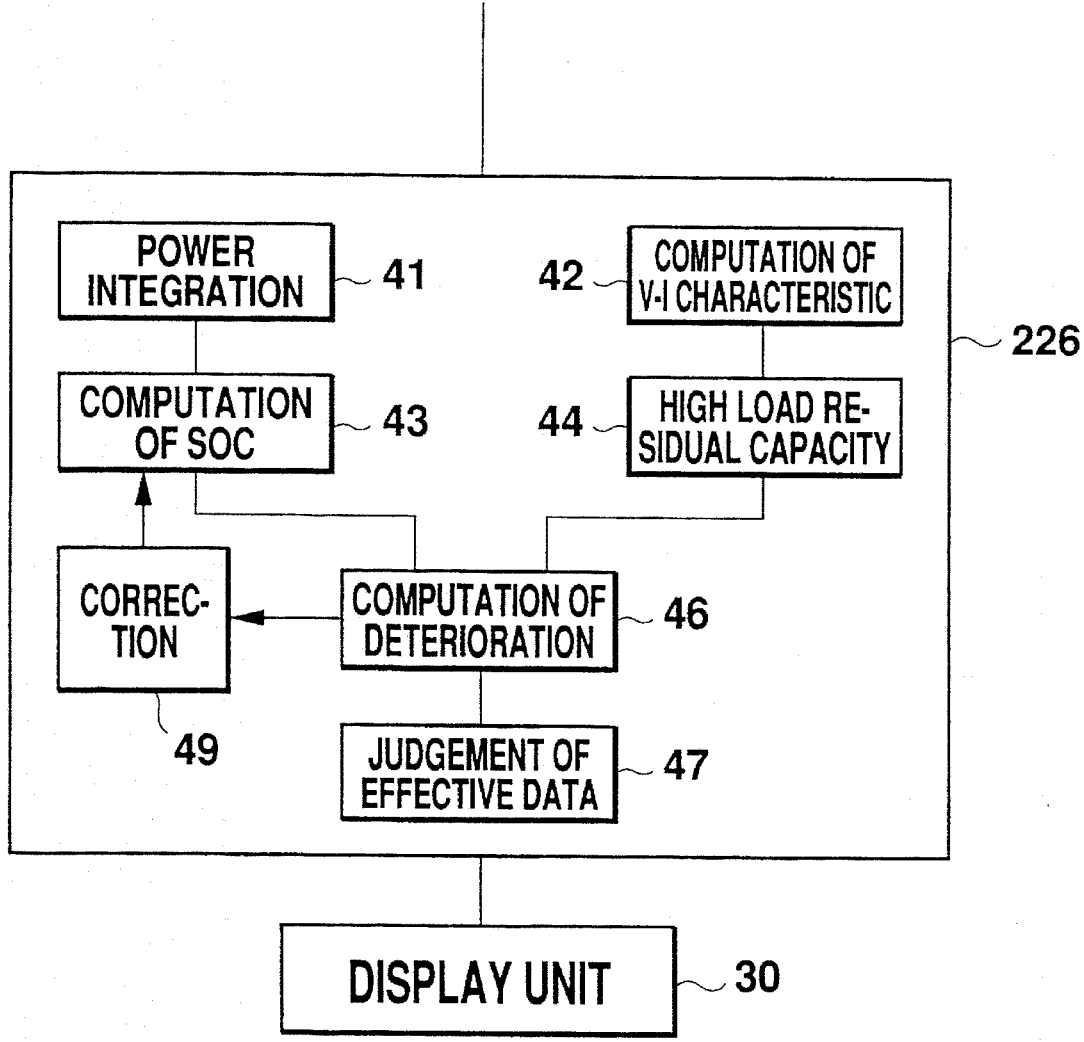
FIG. 12 is a graph showing the structure of a residual battery capacity meter according to a preferred third embodiment of this invention.

FIG. 12 is a block diagram showing the structure of the processing unit 226 of the residual battery capacity meter according to a preferred embodiment of the invention. This processing unit 226, as in the case of the processing unit 26 of the first embodiment, is connected to the ammeter 20, voltmeter 22, thermometer 24 and revolution counter 28, and it reads data from these devices. The processing unit 226 comprises a V-I characteristic computing means 33 which reads data from the ammeter 20, voltmeter 22, thermometer 24 and revolution counter 28, and a residual capacity computing means 35 which reads the data output by this V-I characteristic computing means 33 so as to compute the residual battery capacity. The residual battery capacity computed by the residual capacity computing means 35 is displayed on the display unit 30.

Structure of Device

FIG. 12 is a block diagram showing the structure of a battery residual capacity meter according to a preferred embodiment of the invention. As shown in the figure, the processing unit 10 of the residual capacity meter according to this invention is connected to a voltmeter 22 for detecting the potential difference between the two terminals of the battery 10 supplying power to a vehicle load 11 such as the drive motor of an electric car via a switch 12, an ammeter 20 for measuring the current flowing from the main battery, and a thermometer 24 for monitoring the temperature of the battery 10. The processing unit 226 comprises a power integrating means 41 for reading data from the voltmeter 22 and ammeter 20, and a V-I characteristic computing means 42. The power integrating means 41 is connected to a SOC computing means 43, and the V-I characteristic computing means 42 is connected to a high load residual capacity computing means 44. The SOC computing means 43 computes the charge state (SOC) of the battery 10 by reading data output from the power integrating means 41. The high load residual capacity computing means 44 reads data output by the V-I characteristic computing means 42 so as to compute the high load residual capacity of the battery.

The SOC computing means 43 and the high load residual capacity computing means 44 are both connected to a deterioration detecting means 46. This deterioration detecting means 46 computes the degree of deterioration of the battery 10 based on its charge state output by the SOC computing means 43, and on its high load residual capacity output by the high load residual capacity computing means 44. An effective data judging means 47 is connected to the deterioration detecting means 46. This effective data judging means 47 selects which data is effective for computing the degree of deterioration from the data output by the SOC computing means 43 and the high load residual capacity computing means 44. The deterioration detecting means 46 is connected to a correcting means 49. This correcting means 49, based on the degree of deterioration computed by the deterioration detecting means 46, corrects parameters (full charge capacity of the battery) used by the SOC computing means 43 to compute the charge state of the battery.

The SOC obtained by the SOC computing means 43 or the deterioration detecting means 46, the residual capacity, and the degree of deterioration of the battery, are displayed on the display unit 30.

Computation of Charge State of the Battery

The charge state (SOC) of the battery 10 is computed by the power integrating means 41 and the SOC computing means 43 according to the power integration method based on the integral of the battery discharge current. The computed charge state (SOC) is displayed on the display unit 30 if necessary. Details of this charge state computation are given hereinafter.

Computation of High Load Residual Capacity of the Battery

The high load residual capacity of the battery is computed by measuring the battery voltage under high load (i.e. when the car is accelerating, and the magnitude of the current flowing from the battery 10 is equal to or greater than 0.75 C). This high load residual capacity is taken as the residual capacity of the battery without modification. The facts that the residual capacity of the battery can be readily determined, and that the high load residual capacity is the residual capacity of the battery, have already been explained in the second embodiment with reference to FIG. 8, so an explanation will be omitted here.

The V-I characteristic computing means 42 judges whether or not the value of the current detected by the ammeter 20 is equal to or greater than a predetermined value, and whether or not the current flowing from the battery 10 is increasing. The high load residual capacity computing means 44 is provided with a map showing the correlation between the voltage, current and residual capacity of the battery, and it computes the high load residual capacity of the battery 10 from its discharge voltage when a predetermined current has been discharged.

Figure 13:
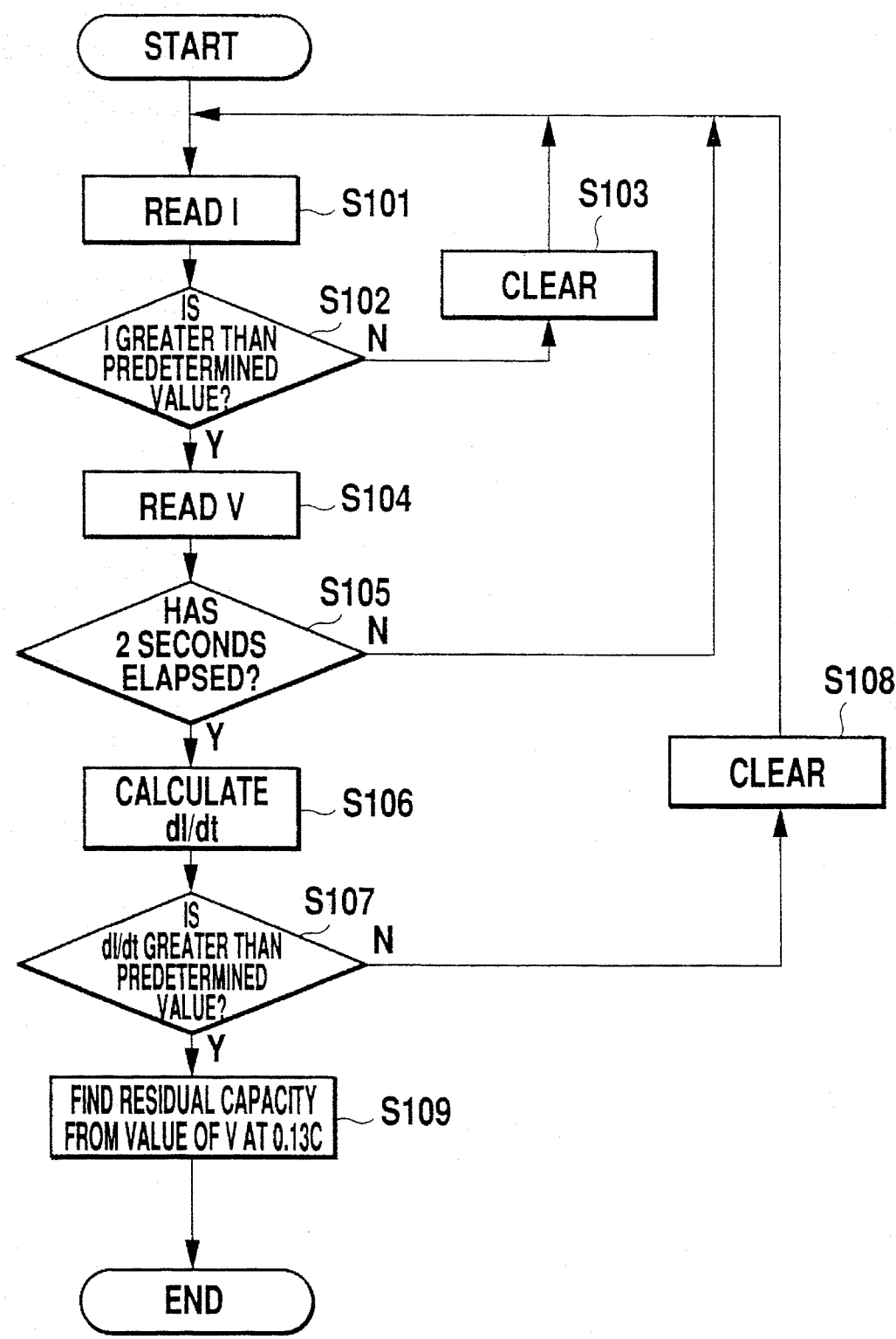
FIG. 13 is a flowchart showing the flow of operations of the residual battery capacity meter according to the third embodiment.

FIG. 13 is a flowchart showing the operation of the high load residual computing means 44 of the third embodiment. As shown in the figure, the V-I characteristic computing means 42 inputs a discharge current I output from the ammeter 20 (S101). Next, it is judged whether the discharge current I is equal to or greater than a predetermined value (S102). For this predetermined value, a current of for example 0.75 C is taken (this 0.75 C means that when it is fully charged, the battery 10 discharges in a time of 1/0.75= 1.33 hours). This is a fairly high current. In the step S102, if the discharge current is less than the predetermined value, the data cannot be used and it is cleared (S103). The program then returns to S101.

If on the other hand it is judged in the step S102 that the discharge current of the battery 10 is equal to or greater than the predetermined value, the voltage of the battery 10 at this time is read by the voltmeter 22 (S104). It is then judged whether or not a predetermined time has elapsed (in the example of the figure, 2 seconds as about this length of time would elapse during normal acceleration, and would be required to raise the current above the predetermined value) (S105). If this time has not elapsed, the program returns to S101 and the sequence is repeated. Therefore, if the value of the current is less than 0.75 C during these 2 seconds, the I,V data are cleared. If 2 seconds elapse for which the discharge current I is not less than 0.75 C, the current change dI/dt during these 2 seconds is calculated (S106). It is then judged whether or not this current change is equal to or greater than a predetermined value (e.g. whether there was an increase from 0.75 C–1.2 C in 2 seconds) (S107). If the increase of the current I was not greater than this predetermined value, the V,I data are cleared (S108), and the program returns to the step S101. As will be described hereinafter, this is based on the knowledge, deduced by studying the relation between the V-I characteristic and residual capacity, that a particularly good correlation is obtained not only when the discharge current I is large, but also when it is increasing. Also, in the steps S106, S107, it may be judged whether or not the current after 2 seconds is greater than a predetermined value, for example 1.2 C.

If the rate of increase of the discharge current was equal to or greater than the predetermined value, the residual capacity of the battery 10 is computed based on the V-I characteristic between the discharge current I and battery voltage V (S109). In other words, under high load conditions when the discharge current I is greater than the predetermined value, and when the rate of increase dI/dt of the discharge current is greater than the predetermined value, there is a good correlation between the voltage-current (V-I) characteristic and the residual capacity of the battery. The relation between the slope of the straight line showing the variation of battery voltage with respect to variation of discharge current, and the residual capacity of the battery, is therefore first stored as a map, the residual capacity of the battery is found from the slope obtained from measured data by referring to the map, the relation between voltage and residual capacity at a specified discharge current is stored as a map, and the residual capacity is then computed from the voltage obtained from measured data by referring to the map. At this time, the battery temperature is also supplied to the processing unit 226 from a temperature sensor 17. The correlation between the battery voltage and residual capacity has a temperature dependence. When calculating the high load residual capacity, therefore, this temperature dependence is used to correct the computed high load residual capacity based on the temperature detected by the temperature sensor 17.

As already explained, FIG. 9 is a diagram showing the relation between battery voltage, current and residual capacity on high load. The discharge current of the battery 10 at this time is 1.3 C. It is seen that there is a good relation between the voltage and the residual capacity when the current has the predetermined value. The relation between battery voltage and residual capacity when the current is for example 1.3 C is stored as a map. The residual capacity of the battery can then be found from this map if the voltage at a current of 1.3 C is found when the car is actually running (S105). In this way, as described hereintofore, the residual capacity is determined only when there is a good correlation between the V-I characteristic and residual capacity, so the residual capacity found is highly reliable.

As the aforementioned conditions often occur in normal running when the car starts, accelerates on high speed or climbs hills, etc., the determination of residual battery capacity can be performed at a suitable frequency.

Further, according to the third embodiment, as the current and voltage are stored over a predetermined time, a voltage corresponding to any current can be estimated (or interpolated) from the stored value. The value of the voltage at 1.3 C can thus be found without actually measuring the voltage at 1.3 C, and the high load residual capacity can be computed from this value. Further, the correlation between the two can be found from the measured voltage and current, and if the correlation is less than a predetermined value, the computation of residual capacity may be stopped.

Detection of Deterioration

If the charge state and high load residual capacity of the battery 10 are detected, the deterioration of the battery can be detected by using these values. As shown in FIG. 3, by plotting several values of charge state with respect to high load residual capacity, the residual capacity of the battery 10 on 100% charge (actual full charge residual capacity, i.e. discharge capacity of the battery 10) can be estimated. Then, by dividing this full charge residual capacity by the rated capacity of the battery 10, its degree of deterioration when in use can be computed. This computation is performed by the deterioration detecting means which inputs the charge state of the battery output by the SOC detecting means 43, and the high load residual capacity of the battery output by the high load residual capacity detecting means 44. As the timing with which the high load residual capacity can be detected is limited, the degree of deterioration is computed only under those conditions when the high load residual capacity can be computed.

Figure 14:
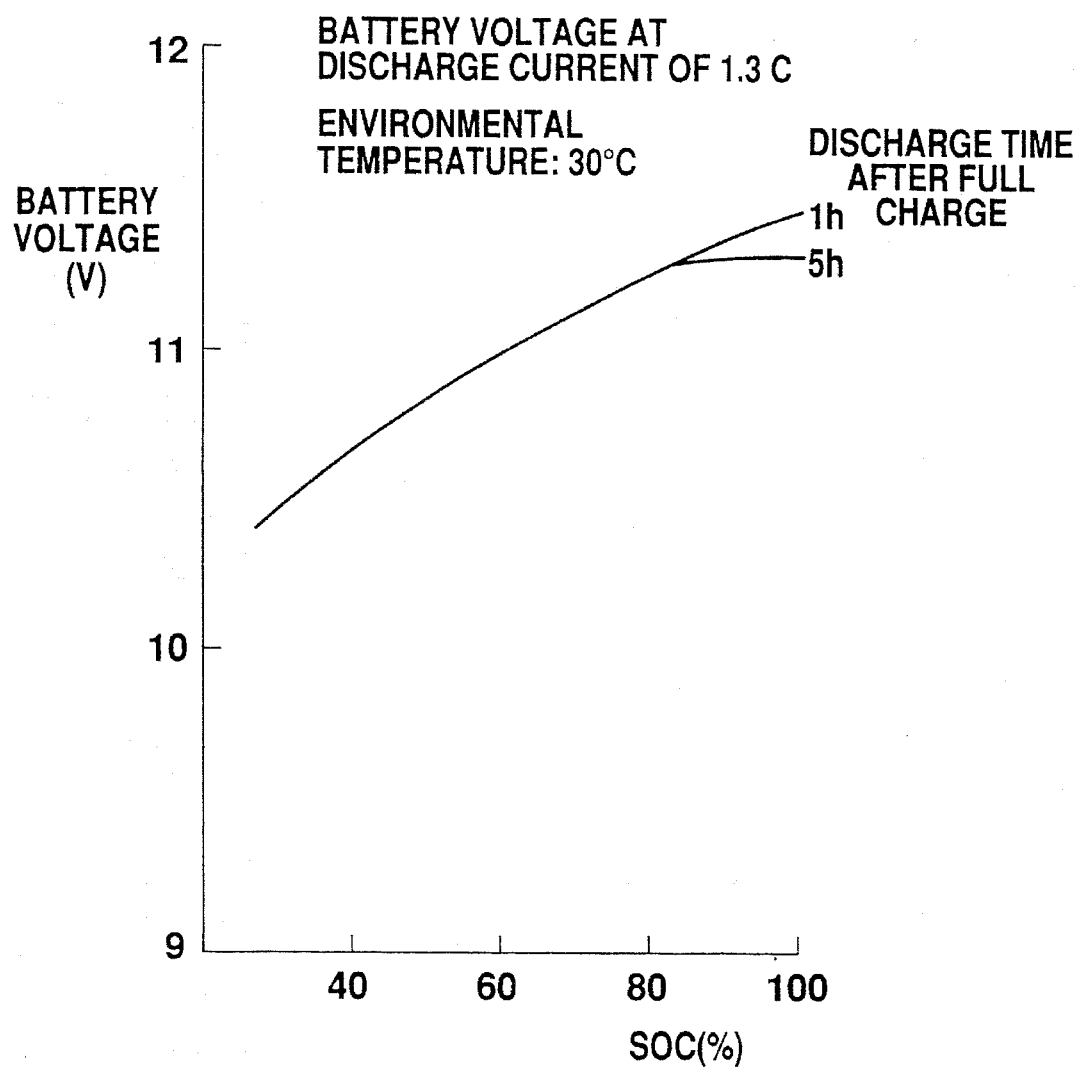
FIG. 14 is a graph showing the variation of the voltage-current characteristic after leaving the battery to stand.

FIG. 14 shows the variation of battery voltage when batteries in different charge states are left to stand, i.e. when the battery 10 is left for 1 hour and when it is left for 5 hours. In this test, the outside temperature was 30° C., and the battery voltage was the voltage when the battery was discharged at a current of 1.3 C. The fact that the battery voltage varies even though the discharge current is constant, means that the residual capacity of the battery 10 is not computed accurately. As can be seen from FIG. 14, when the state of charge (SOC) is 80% or less, the voltage does not vary whether the battery is left for 1 hour or for 5 hours. According to this embodiment, therefore, the effective data judging means 47 limits the range of read data such that the degree of deterioration is computed when the charge state of the battery is less than 80%. Hence, in the processing unit 226 of the residual capacity meter according to this embodiment, the effective data judging means 47 eliminates data when the charge state is higher than 80%, and only data when the charge state is lower than 80% are used for computing the degree of deterioration. Errors due to leaving the battery to stand are thereby eliminated, and the precision of computing the degree of deterioration can be improved. On the other hand, when the charge state of the battery falls below 20%, the effect of voltage fluctuations due to the internal state of the battery and of detection errors in the integrated power increases so that the degree of deterioration can no longer be measured precisely. According to this invention, therefore, data when the charge state is 20%–80% are used for computing the degree of deterioration.

Correction of Power Integration Means

The degree of deterioration of the battery 10 which is thereby computed is output to the correcting means 49. This correcting means 49 corrects the full charge capacity of the battery which is used by the SOC computing means 43 to compute the SOC. The charge state of the battery 10 can therefore be computed according to its degree of deterioration, and the precision of the charge state computed by the power integration method is improved. Although the power integration method permits easy detection whenever required, errors tend to occur easily due to battery deterioration. In the processing unit 226 of the residual battery capacity meter according to this embodiment, the high load residual capacity of the battery 10 is memorized each time it is detected. The degree of deterioration is thus computed at a suitable frequency (e.g. 10 measurements of high load residual capacity and of SOC at that time) in order to correct the full charge capacity of the battery so as to compute the SOC. The precision of the power integration method can therefore be maintained, and a precise residual capacity can always be found based on the corrected SOC.

Figure 15:
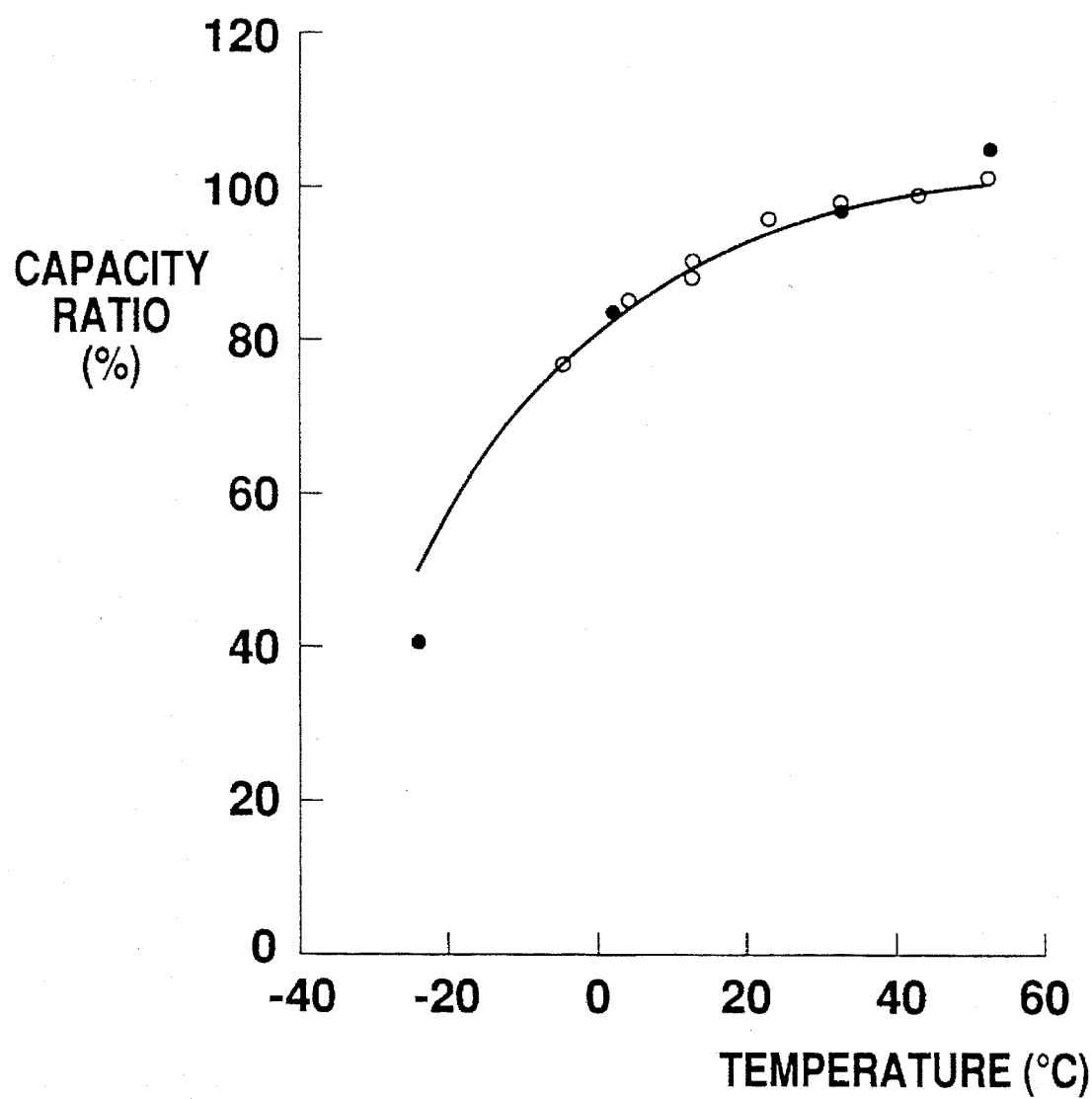
FIG. 15 is a graph showing the variation of battery capacity relative to temperature.

As shown in FIG. 15, the capacity of the battery 10 has a temperature dependence. In this figure, the detected residual capacity at a temperature of 30° C. is taken as 100%, and its ratio is shown with respect to the same residual capacity detected at another temperature. The detected high load residual capacity is thereby corrected based on data from the thermometer 24, and the degree of deterioration of the battery 10 is computed accordingly.

Figure 16:
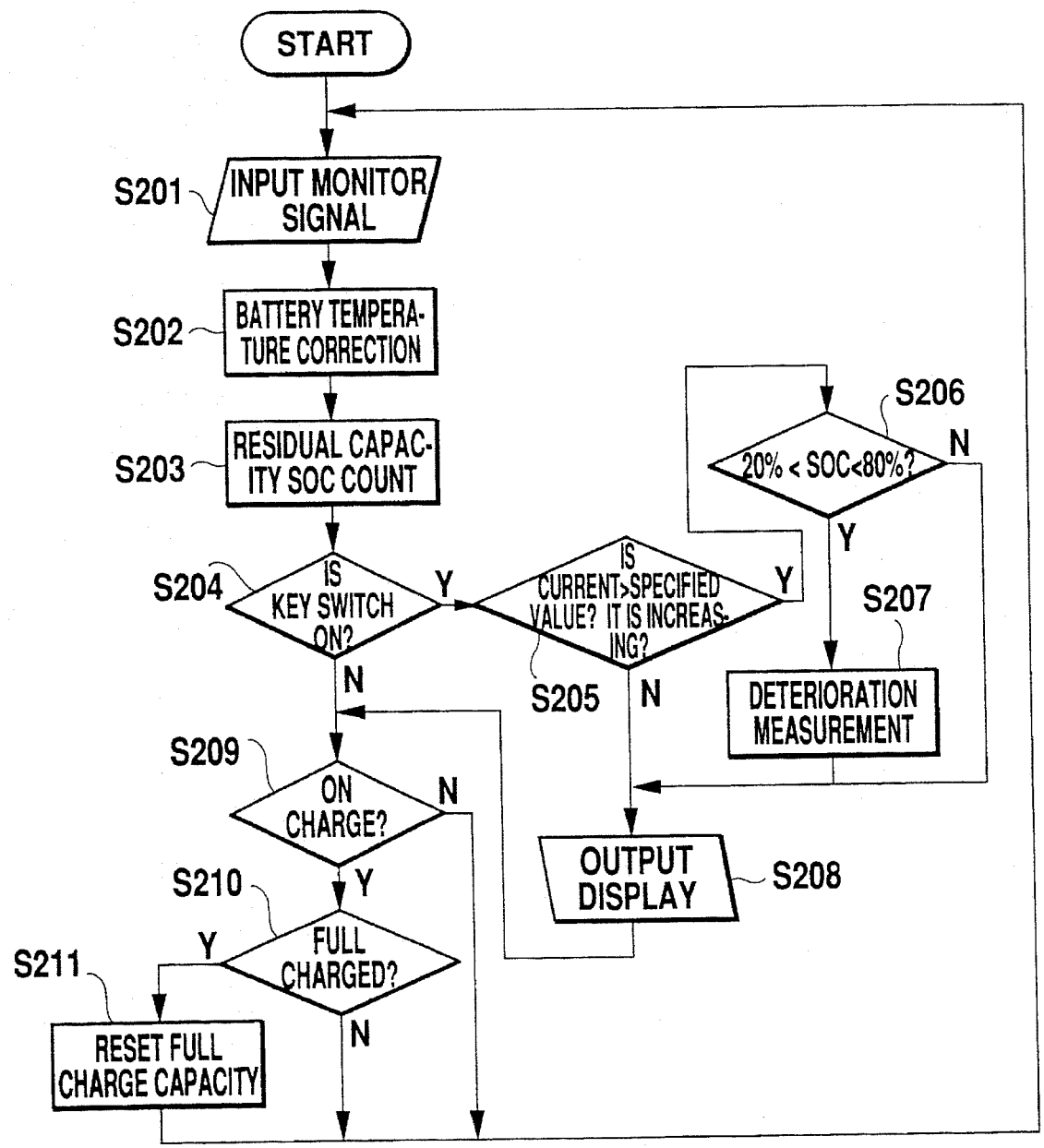
FIG. 16 is a flowchart showing the operations involved in computing the degree of deterioration of the battery.

FIG. 16 is a flowchart showing the operations involved in computing the degree of deterioration of the battery 10.

First, the discharge current and voltage of the battery 10 are read (S201), the temperature of the battery 10 is detected (S202), and its high load residual capacity and charge state are computed (S203). This computation of the charge state in the step S203 is performed by the SOC computing means 43 using the power integration method. In other words, the residual capacity is computed by subtracting the discharged power from the full charge capacity of the battery.

Next, if the key switch is ON (S204), and if the state of the battery 10 is such that the high load residual capacity can be computed, i.e. the current output by the battery is greater than 0.75 C and increasing (S205), the high load residual capacity computing means 44 then computes the high load residual capacity by referring to a map based on the current and voltage at that time. From this computed high load residual capacity and the SOC obtained in the step S202, the deterioration computing means 46 computes the degree of deterioration (S207). Due to control by the effective data judging means 47, the degree of deterioration is measured only when the charge state of the battery 10 is 20%–80% (S206). In the step S205, if it is judged that the high load residual capacity of the battery 10 will not be computed, the residual capacity and charge state computed by the power integration method in the step S203, and the degree of deterioration on preceding occasions, are displayed. If the high load residual capacity of the battery 10 was computed by the high load residual capacity computing means 44, the degree of deterioration computed by the deterioration computing means 46 is displayed (S208). As described hereintofore, computation of the degree of deterioration is performed at a suitable frequency.

The residual capacity may also be updated by the high load residual capacity detecting means 44. In this case, the residual capacity obtained in the step S203 is modified by this detection result, and the residual capacity computed by subtracting the integral of the power discharged after that point from the modified residual capacity. The SOC may also be modified in the same way.

If it is judged after this display, or in the step S204, that the key switch was OFF, it is judged whether or not the battery 10 is on charge (S209). If it was on charge, it is verified whether or not the battery 10 has reached full charge (S210), and if has reached full charge, the count value of the power integral in the power integration method is reset to the full charge capacity value (S211).

Correction of Charge State

If the battery has been fully charged, the reset step of S211 in FIG. 16 is performed, but if the battery is not charged until it is full, reset is not performed. If many charges and discharges are carried out in a relatively short time without charging the battery until it is full, therefore, errors may accumulate in the power integration method.

On the other hand, as there are no sudden changes in the deterioration of the battery when the battery is in normal use, it is unnecessary to measure the deterioration of the battery for some time once the degree of deterioration has been measured. Further, if many charges and discharges are carried out over a short period of time, errors accumulate in the power integration method as described hereinabove, so it is rather inappropriate to compute the degree of deterioration based on the SOC computed by this method. It is thus reasonable to judge that should a difference appear between the degree of deterioration measured at some point in time and the degree of deterioration measured a short time later, an error is occurring in the SOC computed by the power integrating method.

According to this embodiment, if only a short time has elapsed from when the degree of deterioration was measured, it is considered that there is no change in the deterioration. The degree of deterioration is fixed, and the SOC (charge state) computed by the power integration method based on this is corrected. If charge and discharge are repeated and a long time elapses until the battery is fully charged, therefore, a highly precise SOC and residual capacity can still be detected even under conditions in which errors based on the power integration method would accumulate.

Figure 17:
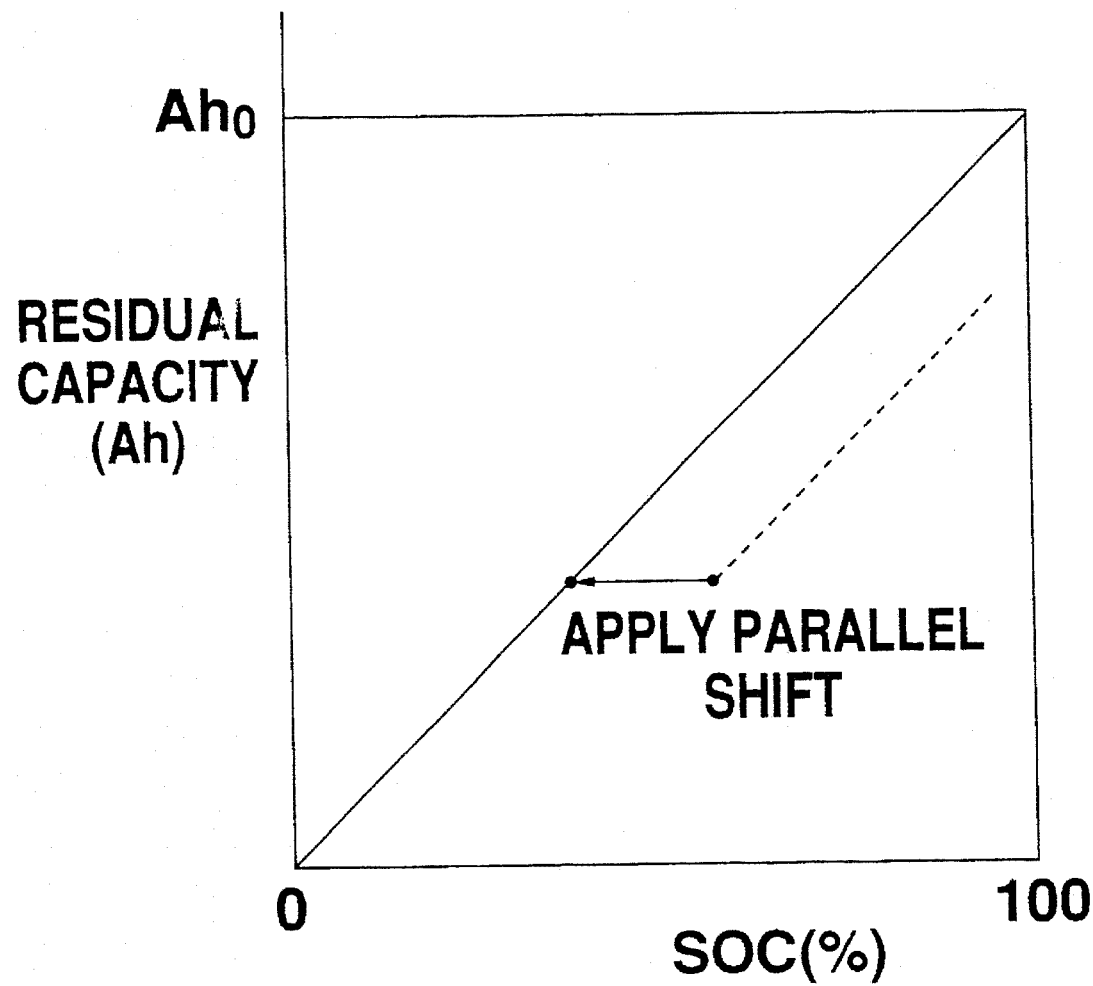
FIG. 17 is a diagram describing the operations involved when the errors of charge state arising in the power integration method are corrected.
Figure 18:
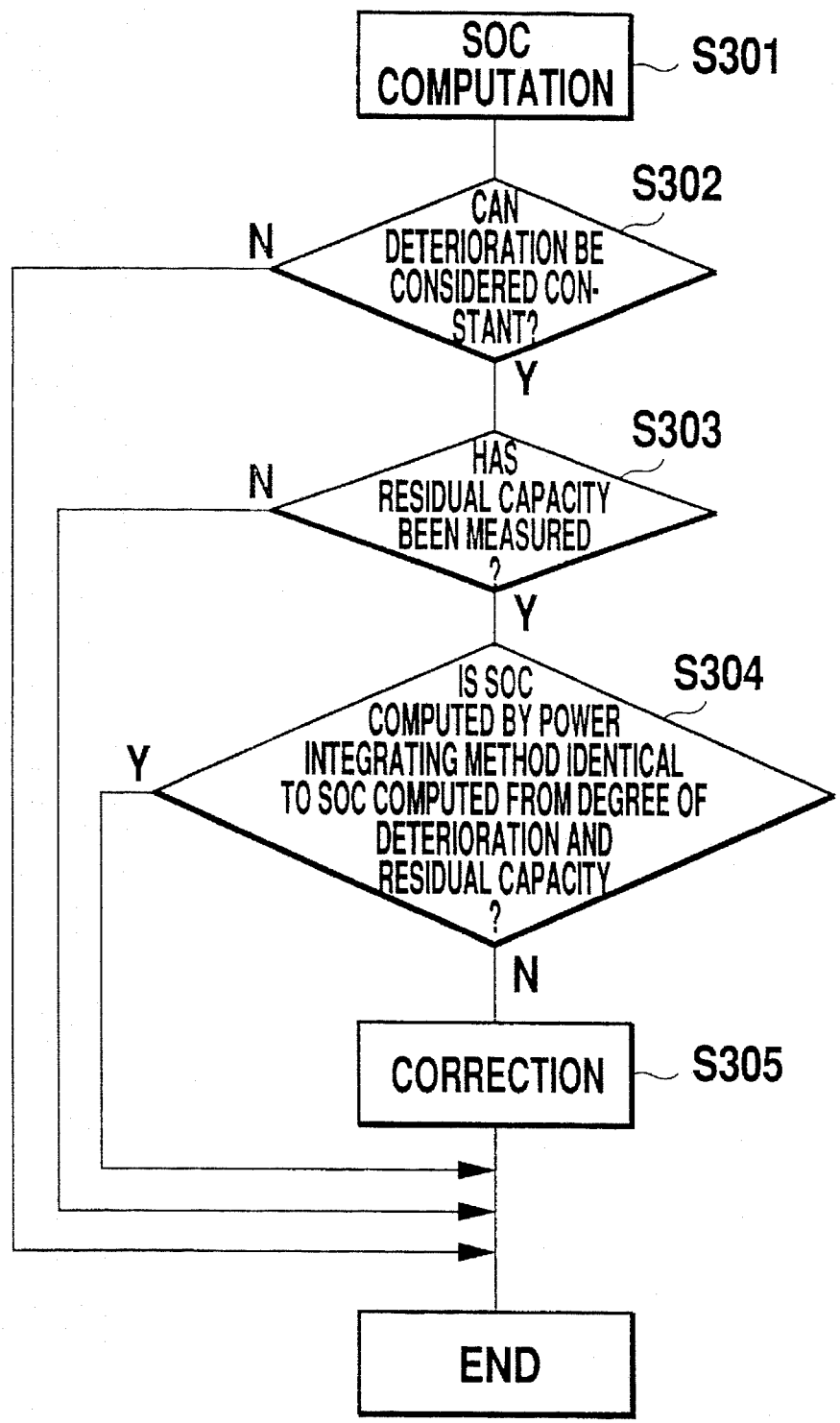
FIG. 18 is a flowchart showing the flow of operations involved when the errors of battery charge state arising in the power integration method are corrected.

To explain this further, if the car runs a long time without the battery being charged until full, errors due to the difference between the integrated power and the actual discharged power gradually accumulate, and if the full charge capacity of the battery is computed from the measured SOC and the high load residual capacity obtained by the high load residual capacity measuring means 44, the result will be different from the actual capacity. If the relation between the SOC computed at this time and the residual capacity obtained by the high load residual capacity measuring means 44 is displayed as shown by the broken line in FIG. 17, a deviation from the actual relation between the two quantities appears. According to this embodiment, as shown in FIG. 17, this type of correction is applied to the power integration method by giving a parallel shift to the deviation due to the accumulated error. If the degree of deterioration can be considered to be constant, the deterioration of the battery 10 is not computed based on the high load residual capacity and the charge state. Instead, the charge state of the battery 10 is computed from this constant degree of deterioration, and the charge state computed by the power integration method is corrected accordingly. This correction process is shown by the flowchart of FIG. 18. If the SOC has been computed by the power integration method (S301), it is judged whether or not the degree of deterioration of the battery 10 can be considered to be constant (S302). As described hereintofore, the situations in which the degree of deterioration of the battery can be considered to be constant, are when only a short time has elapsed from the immediately preceding measurement of degree of deterioration, or when the car has not run for such a long distance or time from the immediately preceding full charge.

If the degree of deterioration can be considered to be constant, the residual capacity of the battery 10 is measured by the high load residual capacity computing means 44 (S303), the charge state (SOC) of the battery 10 is computed based on this residual capacity, and it is judged whether or not this SOC is identical with the SOC computed from the power integration method (S304). If it is not identical, the SOC computed from the power integration method (S304) is corrected (S305).

Computation of SOC

Figure 19:
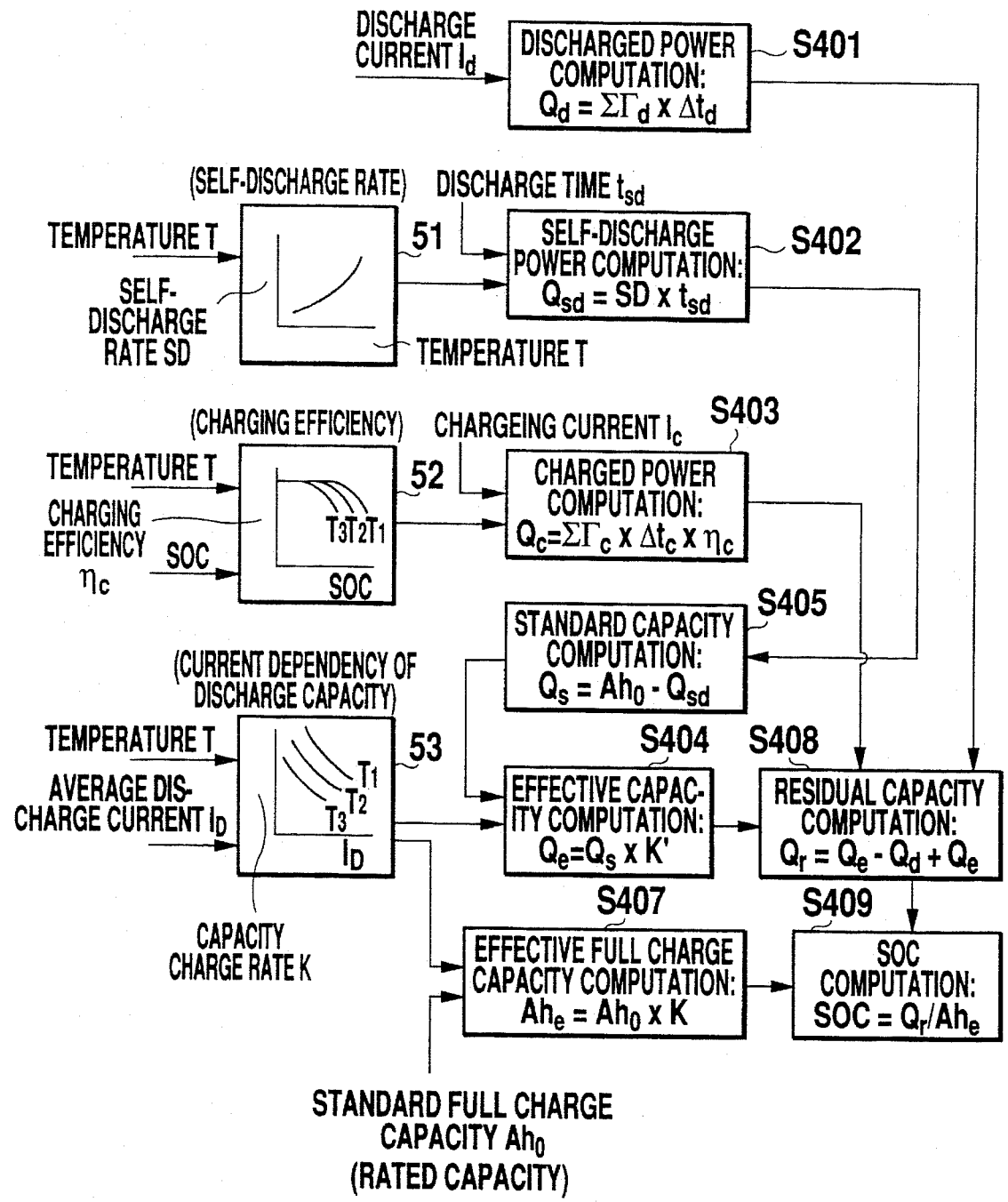
FIG. 19 is a diagram showing the flow of operations involved when the charge state of the battery is computed.

FIG. 19 is a schematic diagram showing the reading of data when the charge state SOC of the battery is calculated by the power integration method, and the flow of this data.

First, in a step 401, discharge current $I_d$ data are successively read from the ammeter 20, and a discharged power $Q_d$ of the battery is computed. At the same time, in a step S402, a standing time $t_{sd}$ is read, and the power lost by self-discharge $Q_{sd}$ is computed. In this step S402, reference is made to a map 51 showing the relation between a self-discharge rate found by computing the self-discharge power $Q_{sd}$ and temperature. In other words, the standing time $t_{sd}$ is multiplied by the self-discharge rate SD at the temperature at that time so as to compute a self-discharge power $Q_{sd}$. Temperature data are read from the thermometer 24.

In a step S403, a charged power $Q_c$ is calculated. A charging current $I_c$ is integrated over the charging time, and this is multiplied by the charging efficiency—c so as to compute the charged power $Q_c$. The charging efficiency—c is obtained from charge state SOC data and temperature data referring to a map 52. The power which can actually be discharged by the battery (standard capacity) depends on the self-discharge power. In a step S405, therefore, the standard capacity $Q_s$ is calculated by subtracting the self-discharge power from the rated capacity $Ah_0$. Further, the power which can be discharged by the battery varies with the discharge current. In a step S404, therefore, reference is made to a map 53 showing the relation between discharge current and variation of capacity, and the effective capacity of the battery 10 is then calculated by multiplying the standard capacity $Q_s$ by a capacity variation rate K. Then in a step S407, using the map 53 showing the current dependence of discharge power, an effective full charge capacity, which is the full charge capacity of the battery that is actually available, is computed.

A residual capacity $Q_r$ is found by adding the charged power $Q_c$ to an effective capacity $Q_e$, and subtracting the discharged power $Q_d$ which is discharged (S408). The charge state of the battery is then calculated by dividing this residual capacity $Q_r$ by an effective full charge capacity $Ah_e$ (S409). The charge state (SOC) and residual capacity may also be computed in this way by power integration.

From this computed SOC and the residual capacity obtained by the high load residual capacity computing means 44, the deterioration computing means 46 computes the degree of deterioration, and corrects the rated capacity by the degree of deterioration. Then, by computing the effective full charge capacity in the step S407, a precise SOC can be computed.

The residual capacity meter according to the third embodiment of this invention therefore eliminates the disadvantage of the power integration method that although computations could be carried out continuously, errors accumulate due to the large effect of battery deterioration, and the disadvantage of the residual capacity measurement method that, although the deterioration of the battery was small and precision was high, computations could not be carried out continuously. According to this invention, the residual capacity of the battery is constantly displayed by the power integration method so that the driver always knows its value. At the same time, errors arising in the power integration method are corrected at a predetermined timing by the residual capacity measurement method which minimizes the effect of battery deterioration and has good precision. A highly precise residual capacity can therefore always be obtained.

What is claimed:

1. A residual capacity meter for detecting the deterioration of a battery in an electric car, comprising:

current detecting means for detecting a battery discharge current, change detecting means for detecting a time rate of change of the battery discharge current detected by said current detecting means, voltage detecting means for detecting a battery discharge voltage when the battery is discharging, condition judging means for judging whether the battery discharge current detected by said current detecting means is greater than a predetermined value and whether the time rate of change of the battery discharge current detected by said change detecting means is increasing, residual capacity computing means for computing a residual battery capacity as a function of battery discharge current and the battery discharge voltage when judged by said condition judging means that the battery discharge current detected by said current detecting means is greater than a predetermined value and the time rate of change of the battery discharge current detected by said change detecting means is increasing.

2. A residual capacity meter as defined in claim 1, further comprising correcting means for correcting the residual battery capacity.

3. A residual capacity meter for detecting the deterioration of a battery in an electric car, comprising:

current detecting means for detecting a battery discharge current, change detecting means for detecting a time rate of change of the battery discharge current detected by said current detecting means, voltage detecting means for detecting a battery discharge voltage when the battery is discharging, condition judging means for judging whether the battery discharge current detected by said current detecting means is greater than a predetermined value and whether the time rate of change of the battery discharge current detected by said change detecting means is increasing, high load residual capacity computing means for computing a high load battery residual capacity as a function of the battery discharge current and the battery discharge voltage when judged by said condition judging means that the battery discharge current detected by said current detecting means is greater than a predetermined value and the time rate of change of the battery discharge current detected by said change detecting means is increasing, charge state computing means for computing a battery charge state by integrating the battery discharge current detected by said current detecting means, deterioration computing means for computing a degree of battery deterioration based on the battery charge state and the high load battery residual capacity.

4. A residual capacity meter as defined in claim 3, wherein said deterioration computing means computes the degree of battery deterioration using the battery charge state and the high load battery residual capacity when the battery charge state is in the range 80%–20%.

5. A residual capacity meter as defined in claim 3, further comprising correcting means for correcting the battery charge state detected by said charge state detecting means based on the degree of battery deterioration computed by said deterioration computing means.

6. A residual capacity meter as defined in claim 5, wherein said deterioration computing means computes the degree of battery deterioration using the battery charge state and the high load battery residual capacity when the battery charge state is in the range 80%–20%.

7. A residual capacity meter as defined in claim 3, further comprising correcting means for correcting the battery charge state based on the high load battery residual capacity during a predetermined period of time when the degree of battery deterioration remains constant.

* * * * *